(12) United States Patent
Sasaki et al.

(10) Patent No.: US 10,944,045 B2
(45) Date of Patent: *Mar. 9, 2021

(54) MAGNETIC MEMORY

(71) Applicant: TDK CORPORATION, Tokyo (JP)

(72) Inventors: Tomoyuki Sasaki, Tokyo (JP); Yohei Shiokawa, Tokyo (JP); Atsushi Tsumita, Tokyo (JP)

(73) Assignee: TDK CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/271,112

(22) Filed: Feb. 8, 2019

(65) Prior Publication Data

US 2019/0189909 A1 Jun. 20, 2019

Related U.S. Application Data

(63) Continuation of application No. 15/711,506, filed on Sep. 21, 2017, now Pat. No. 10,205,088.

(30) Foreign Application Priority Data

Oct. 27, 2016 (JP) ................................ 2016-210535
Jul. 14, 2017 (JP) ................................ 2017-138387

(51) Int. Cl.
*H01L 43/04* (2006.01)
*G11C 11/18* (2006.01)
(Continued)

(52) U.S. Cl.
CPC ............ *H01L 43/04* (2013.01); *G11C 11/161* (2013.01); *G11C 11/18* (2013.01); *H01L 27/228* (2013.01);
(Continued)

(58) Field of Classification Search
CPC ......... H01L 43/04; H01L 43/08; H01L 43/10; H01L 43/14; G11C 11/161
See application file for complete search history.

(56) References Cited

U.S. PATENT DOCUMENTS 8,350,347 B2    1/2013  Gaudin et al.
10,205,088 B2 *  2/2019  Sasaki ..................... G11C 11/18
(Continued)

FOREIGN PATENT DOCUMENTS

JP      2011-138604 A    7/2011
JP      2014-207469 A    10/2014
WO      2016/021468 A1   2/2016

OTHER PUBLICATIONS

Miron et al; "Perpendicular switching of a single ferromagnetic layer induced by in-plane current injection;" Nature; 2011; vol. 476; No. 189; 6 pp.

(Continued)

*Primary Examiner* — Mark V Prenty
(74) *Attorney, Agent, or Firm* — Oliff PLC

(57) ABSTRACT

A magnetic memory including a plurality of magnetoresistance effect elements that hold information, each including a first ferromagnetic metal layer with a fixed magnetization direction, a second ferromagnetic metal layer with a varying magnetization direction, and a non-magnetic layer sandwiched between the first and second ferromagnetic metal layers; a plurality of first control elements that control reading of the information, wherein each of the plurality of first ferromagnetic metal layers is connected to a first control element; a plurality of spin-orbit torque wiring lines that extend in a second direction intersecting with a first direction which is a stacking direction of the magnetoresistance effect elements, wherein each of the second ferromagnetic metal layers is joined to one spin-orbit torque wiring line; a (Continued)

plurality of second control elements that control electric current flowing through the spin-orbit torque wiring lines.

7 Claims, 14 Drawing Sheets

(51) Int. Cl.
    *H01L 27/22*     (2006.01)
    *G11C 11/16*     (2006.01)
    *H01L 43/08*     (2006.01)
    *H01L 43/10*     (2006.01)
    *H01L 43/14*     (2006.01)

(52) U.S. Cl.
    CPC .............. *H01L 43/08* (2013.01); *H01L 43/10* (2013.01); *H01L 43/14* (2013.01); *G11C 11/1659* (2013.01); *G11C 11/1673* (2013.01); *G11C 11/1675* (2013.01)

(56) References Cited

U.S. PATENT DOCUMENTS

| | | |
|---|---|---|
| 2012/0320666 A1 | 12/2012 | Ohno et al. |
| 2015/0348606 A1 | 12/2015 | Buhrman et al. |
| 2017/0222135 A1 | 8/2017 | Fukami et al. |
| 2018/0123022 A1 | 5/2018 | Sasaki et al. |

OTHER PUBLICATIONS

Kato et al; "Observation of the Spin Hall Effect in Semiconductors;" Science; 2004; vol. 306; No. 1910; pp. 1910-1913.

Liu et al; "Spin torque switching with the giant spin Hall effect of tantalum;" Science; 2012; vol. 336; No. 555; 32 pp.

Liu et al; "Current-Induced Switching of Perpendicularly Magnetized Magnetic Layers Using Spin Torque from the Spin Hall Effect;" Physical Review Letters; 2012; vol. 109; No. 096602; 5 pp.

Lee et al; "Threshold current for switching of a perpendicular magnetic layer induced by spin Hall effect;" Applied Physics Letter; 2013; vol. 102; Mo. 112410; 18 pp.

Lee et al; "Thermally activated switching of perpendicular magnet by spin-orbit spin torque;" Applied Physics Letters; 2014; vol. 104; No. 072413; 6 pp.

Fukami et al; "Magnetization switching by spin-orbit torque in an antiferromagnet-ferromagnet bilayer system;" Nature Materials; 2016; vol. 15; pp. 535-542.

Fukami et al; "A spin-orbit torque switching scheme with collinear magnetic easy axis and current configuration;" Nature Nanotechnology; 2016; vol. 11; No. 621; 6 pp.

Takahashi et al; "Spin injection and detection in magnetic nanostructures;" Physical Review B67; 2003; No. 052409; 4 pp.

Seo et al; "Area-Efficient SOT-MRAM With a Schottky Diode;" IEEE Electron Device Letters; 2016; vol. 37; No. 8; pp. 982-985.

* cited by examiner

FIG. 15
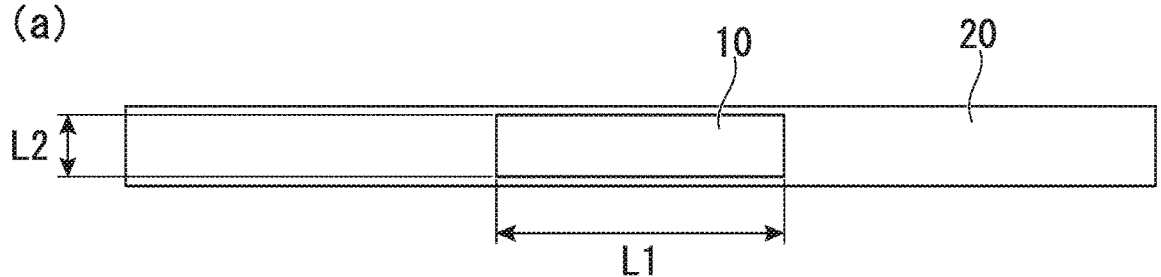
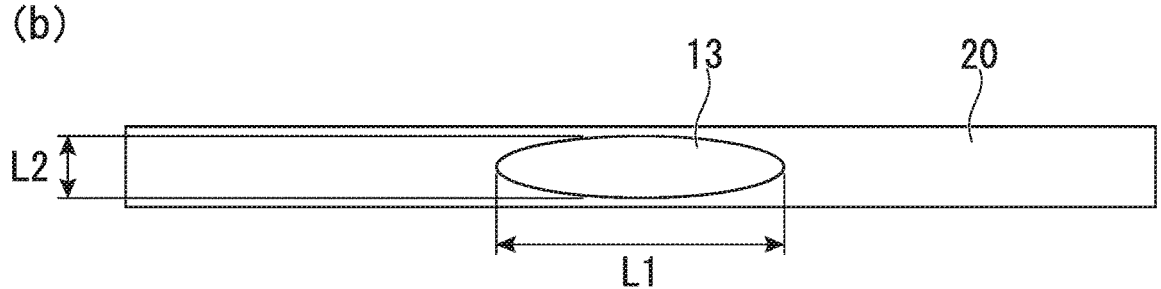
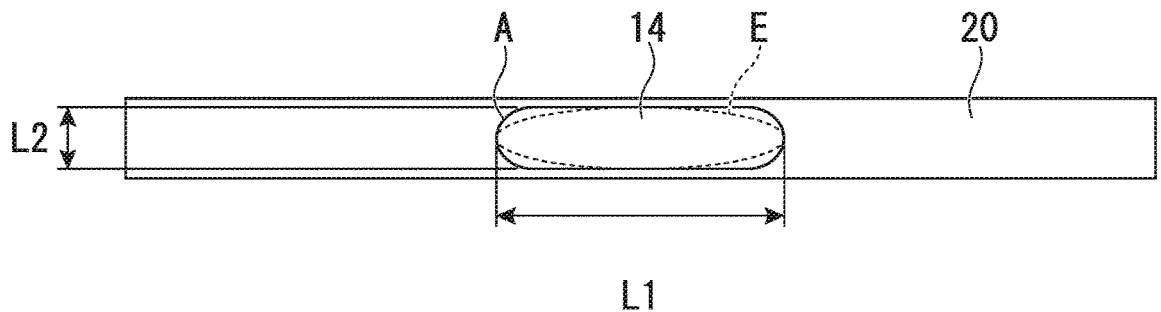
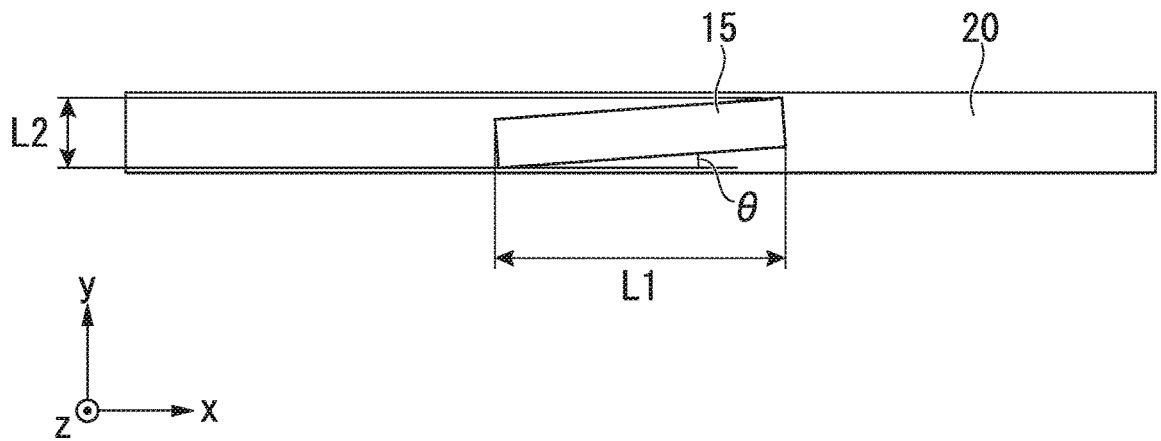

FIG. 16
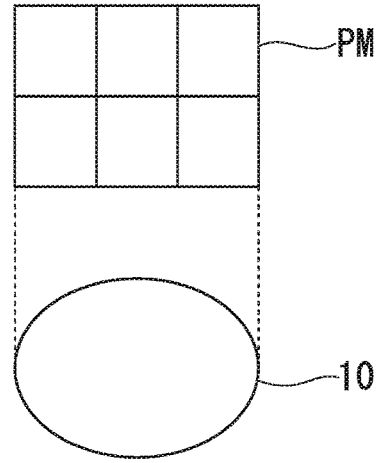
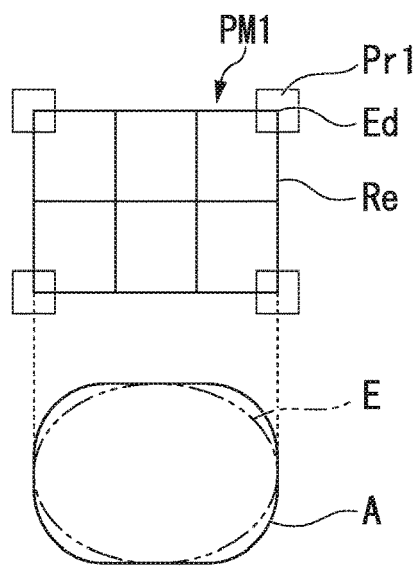
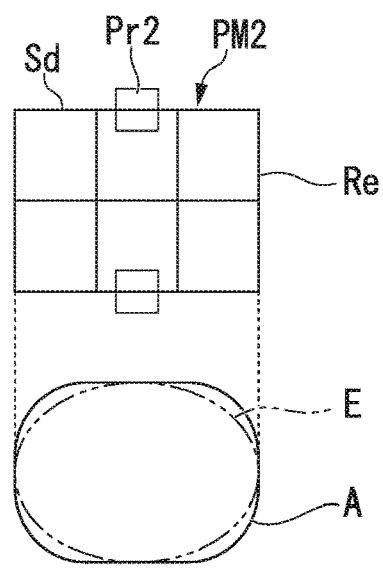

MAGNETIC MEMORY

FIELD OF THE INVENTION AND CROSS-REFERENCE TO RELATED APPLICATIONS

The present invention relates to a magnetic memory. This is a Continuation of application Ser. No. 15/711,506 filed Sep. 21, 2017, which claims the benefit of Japanese Patent Application No. 2016-210535, filed Oct. 27, 2016, and Japanese Patent Application No. 2017-138387, filed Jul. 14, 2017, the contents of which are incorporated herein by reference.

DESCRIPTION OF RELATED ART

Description of Related Art

Examples of known magnetoresistance effect elements include giant magnetoresistance (GMR) elements composed of a multilayer film of ferromagnetic layers and non-magnetic layers, and tunnel magnetoresistance (TMR) elements which use insulating layers (tunnel barrier layers, barrier layers) for the non-magnetic layers. Generally, TMR elements have a larger element resistance than GMR elements, but the magnetoresistance (MR) ratio is larger than GMR elements. Consequently, TMR elements are attracting much attention as elements for magnetic sensors, high-frequency components, magnetic heads and non-volatile random access memory (MRAM).

MRAM reads and writes data by utilizing the characteristic that when the relative orientation between the magnetizations of two ferromagnetic layers that sandwich an insulating layer is changed, the element resistance of the TMR element changes. Examples of known methods for writing to MRAM include a method in which a magnetic field generated by an electric current is used to perform writing (magnetization reversal), and a method in which a spin transfer torque (STT) generated by passing an electric current through the stacking direction of a magnetoresistance effect element is used to perform writing (magnetization reversal).

Additionally, in recent years, there has been a demand for higher integration of MRAM (for example, see Patent Document 1). In order to achieve high-density integration of MRAM, the TMR elements must be made more compact. However, if the TMR elements are made more compact, the magnetization stability decreases. Decreases in the magnetization stability can cause rewriting of data under the influence of heat or the like (for example, see Patent Document 2). MRAM has the purpose of allowing long-term storage of data, and it is not permissible for the data to be spontaneously rewritten.

As methods for raising the magnetization stability, a method of increasing the volume of the ferromagnetic layers and a method of increasing the magnetic anisotropic energy of the ferromagnetic layers may be contemplated. However, magnetic anisotropic energy is material-specific, and depends on the material used in the ferromagnetic layers and the state of the interface between the ferromagnetic layers and the other layers. In order to achieve long-term storage of data, the volume of the ferromagnetic layers must be made a predetermined size or greater. For this reason, it is difficult to increase the magnetic anisotropic energy without taking these restrictions into consideration. The ferromagnetic layers are thin-films, for which the volumes are approximately the same as the areas.

RELATED LITERATURE

Patent Documents

Patent Document 1
JP 2014-207469 A
Patent Document 2
JP 2011-138604 A

Non-Patent Documents

Non-Patent Document 1
I. M. Miron, K. Garello, G. Gaudin, P.-J. Zermatten, M. V. Costache, S. Auffret, S. Bandiera, B. Rodmacq, A. Schuhl, and P. Gambardella, Nature, 476, 189 (2011).

BRIEF SUMMARY OF THE INVENTION

The intensity of spin transfer torque (STT) is determined by the current density of the electric current flowing in the stacking direction of a magnetoresistance effect element. For this reason, in order to reverse the magnetization by means of STT, the current density must be a predetermined value or greater. Conversely, in order to raise the thermal stability of the magnetoresistance effect element, an "area of a predetermined size or greater" is needed. Thus, in order to drive an element that reverses magnetization by STT, it is necessary to supply, in the stacking direction of the magnetoresistance effect element, an electric current having a current amount obtained by multiplying a "current density of a predetermined value or greater" with an "area of a predetermined size or greater".

However, if the current amount flowing through a single TMR element or GMR element is too large, the operating life of the element can be affected. For example, the insulating layers of the TMR element may undergo insulation breakdown and the element may become incapable of recording data.

Additionally, if the current amount flowing through a single TMR element or GMR element becomes large, then the current amount necessary for the MRAM overall will also become large. For example, when the elements are connected in parallel, a total current which is the "current amount necessary for a single element"×the "number of elements" will be necessary in the MRAM overall.

Additionally, when the current amount flowing through each TMR element or GMR element becomes large, the reversal current (leak current) increases, and a circuit configuration for preventing this leak current becomes necessary. As a result, the integration rate of the integrated circuit becomes lower.

The present invention was made in view of the above-mentioned problems, and has the purpose of providing a magnetic memory that can lower the reversal current and increase the integration density.

(1) In order to achieve the above-mentioned purpose, a magnetic memory (200) according to one embodiment of the present invention comprises a plurality of magnetoresistance effect elements (10) that hold information, each comprising a first ferromagnetic metal layer (1) with a fixed magnetization direction, a second ferromagnetic metal layer (2) with a varying magnetization direction, and a non-magnetic layer (3) sandwiched between the first ferromagnetic metal layer and the second ferromagnetic metal layer; a plurality of first control elements (read control elements 110) that control reading of the information, wherein each of the plurality of first ferromagnetic metal layers is connected to a first control element; a plurality of spin-orbit torque wiring lines (20) that extend in a second direction (x-direction) intersecting with a first direction (z-direction) which is a stacking direction of the magnetoresistance effect elements, wherein each of the second ferromagnetic metal layers is joined to one spin-orbit torque wiring line; a plurality of second control elements (element selection control elements 120) that control electric current flowing through the spin-orbit torque wiring lines, wherein a first connection point (the other end of the resistance 22) in each of the spin-orbit torque wiring lines is connected to one second control element; and a third control element (write control element 130) that controls writing of the information, connected to a second connection point (the other end of the resistance 21) in each of the plurality of spin-orbit torque wiring lines.

(2) In order to achieve the above-mentioned purpose, a magnetic memory (200A) according to one embodiment of the present invention comprises a plurality of magnetoresistance effect elements (10) that hold information, each comprising a first ferromagnetic metal layer (1) with a fixed magnetization direction, a second ferromagnetic metal layer (2) with a varying magnetization direction, and a non-magnetic layer (3) sandwiched between the first ferromagnetic metal layer and the second ferromagnetic metal layer; a first control element (read control element 110) that controls reading of the information, connected to each of the plurality of first ferromagnetic metal layers; a plurality of spin-orbit torque wiring lines (20) that extend in a second direction (x-direction) intersecting with a first direction (z-direction) which is a stacking direction of the magnetoresistance effect elements, wherein each of the second ferromagnetic metal layers is joined to one spin-orbit torque wiring line; a plurality of second control elements (element selection control elements 120) that control electric current flowing through the spin-orbit torque wiring lines, wherein a first connection point (the other end of the resistance 22) in each of the spin-orbit torque wiring lines is connected to one second control element; and a plurality of third control elements (write control elements 130) that control writing of the information, wherein a second connection point (the other end of the resistance 21) in each of the spin-orbit torque wiring lines is connected to one third control element.

(3) Additionally, in a magnetic memory (200 or 200A) according to one embodiment of the present invention, long axes of the magnetoresistance effect elements (10), on a surface perpendicular to the first direction (z-direction), may be oriented in the second direction (x-direction).

(4) Additionally, in a magnetic memory (200) according to one embodiment of the present invention, the first control elements (read control elements 110) and the second control elements (element selection control elements 120) may be proximately arranged in a third direction (y-direction) intersecting with the first direction (z-direction) and the second direction (x-direction).

(5) Additionally, in a magnetic memory (200A) according to one embodiment of the present invention, the second control elements (element selection control elements 120) and the third control elements (write control elements 130) may be proximately arranged in a third direction (y-direction) intersecting with the first direction (z-direction) and the second direction (x-direction).

(6) Additionally, in a magnetic memory (200 or 200A) according to one embodiment of the present invention, in a spatial configuration that is necessary for storing one bit of the information, when a unit of a minimum processing size of length in a circuit configuration is defined as F, the length in the third direction (y-direction) may be 8 F.

(7) Additionally, in a magnetic memory (200 or 200A) according to one embodiment of the present invention, in a spatial configuration that is necessary for storing one bit of the information, when a unit of a minimum processing size of length in a circuit configuration is defined as F, an area of a surface in the second direction (x-direction) and the third direction (y-direction) that is necessary for the circuit configuration may be 16 $F^2$ to 1056 $F^2$.

(8) Additionally, in a magnetic memory (200 or 200A) according to one embodiment of the present invention, a maximum electric current flowing in the second control elements (element selection control elements 120) and the third control elements (write control elements 130) may be greater than a maximum electric current flowing in the first control elements (read control elements 110).

(9) Additionally, in a magnetic memory (200 or 200A) according to one embodiment of the present invention, resistance values of the magnetoresistance effect elements (10) may be higher than the resistance values of spin-orbit torque wiring (20) layers that are in contact with the magnetoresistance effect elements.

(10) Additionally, in a magnetic memory (200 or 200A) according to one embodiment of the present invention, the resistance values of the first control elements (read control elements 110) may be lower than the resistance values of the magnetoresistance effect elements (10).

(11) Additionally, in a magnetic memory (200 or 200A) according to one embodiment of the present invention, the magnetoresistance effect elements (10) may be arranged at equidistant intervals in the second direction (x-direction).

(12) Additionally, in a magnetic memory (200 or 200A) according to one embodiment of the present invention, regions necessary for storing one bit of the information may be proximately arranged at equidistant intervals in the second direction (x-direction).

(13) Additionally, in a magnetic memory (200 or 200A) according to one embodiment of the present invention, regions necessary for storing one bit of the information may be proximately arranged at equidistant intervals in the third direction (y-direction).

(14) Additionally, in a magnetic memory (200B) according to one embodiment of the present invention, an insulating layer (181) may be provided so as to contact the magnetoresistance effect elements 10, and magnetic-field-providing wiring (182) may be provided so as to apply, from across the insulating layer, a magnetic field in a direction perpendicular to the magnetization direction of the magnetoresistance effect elements.

Based on the spin-orbit torque type magnetoresistance effect elements according to one embodiment of the present invention, it is possible to lower the reversal current and increase the integration density.

BRIEF DESCRIPTION OF THE DRAWINGS

FIG. 15 is a diagram illustrating the spin-orbit torque type magnetoresistance effect element according to the third embodiment, when viewed from the z-direction.

FIG. 16 is a diagram illustrating the correspondence between the shape of a photomask and the planar shape of the resulting magnetoresistance effect element when viewed from the z-direction.

DETAILED DESCRIPTION OF THE INVENTION

The present invention is described below in further detail, with reference to the drawings. The drawings used in the following description may be drawn with specific portions enlarged as appropriate to facilitate comprehension of the features of the present invention, and the dimensional ratios and the like between the constituent elements may differ from the actual values. Further, the materials and dimensions and the like presented in the following examples are merely examples, which in no way limit the present invention, and may be altered as appropriate within the scope of the present invention.

First Embodiment

A circuit example of the magnetic memory 200 will be explained. The operating principles and the like of the spin-orbit torque type magnetoresistance effect element will be explained below.

Figure 1:
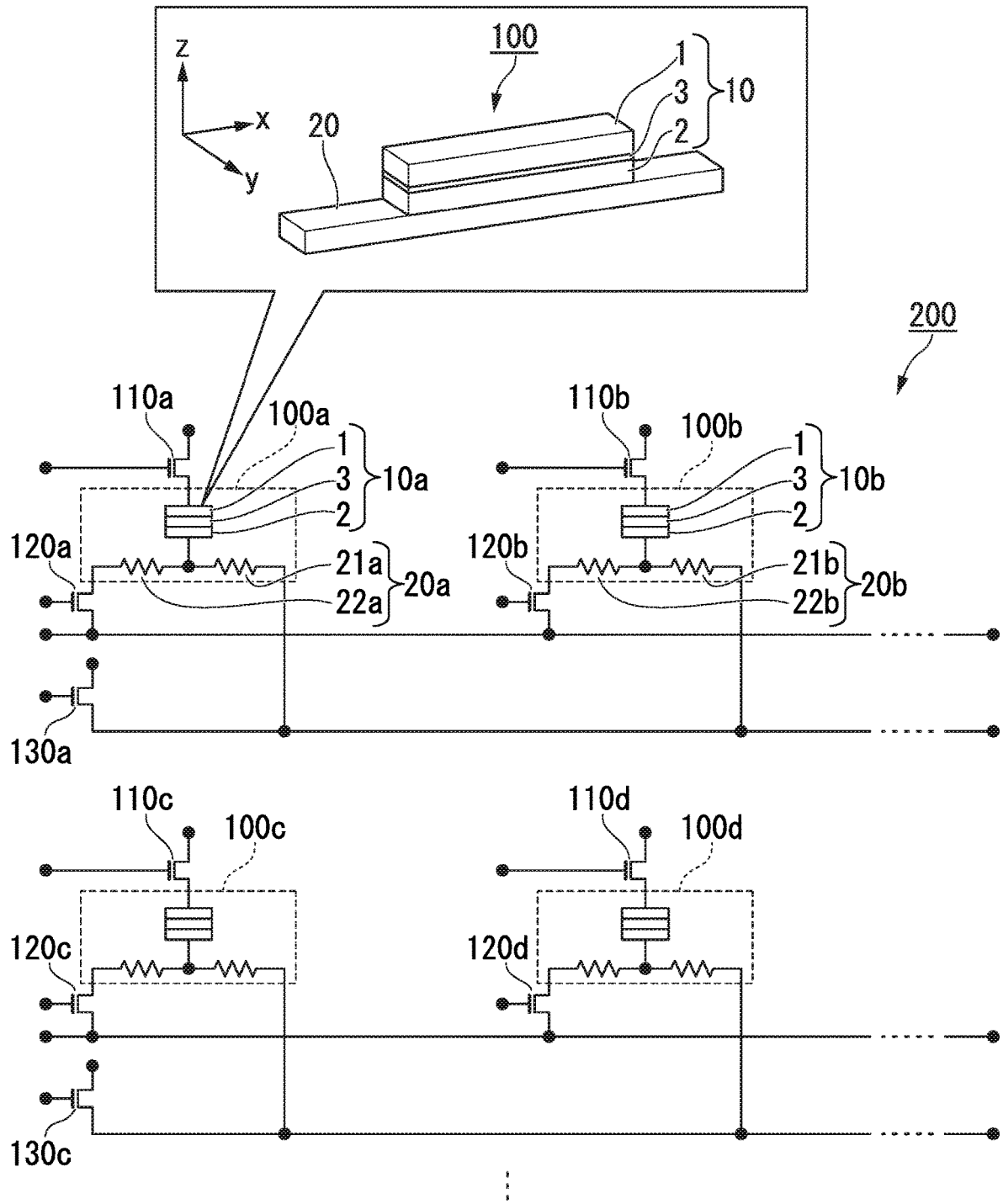
FIG. 1 is a circuit diagram of an example of a magnetic memory in accordance with a first embodiment.

FIG. 1 is a circuit diagram of an example of the magnetic memory 200 according to the first embodiment. In FIG. 1, the stacking direction of the magnetoresistance effect element 10 is defined as the z-direction, the first direction in which the spin-orbit torque wiring 20 extends is defined as the x-direction, and the second direction which is orthogonal to both the z-direction and the x-direction is defined as the y-direction.

The magnetic memory 200 illustrated in FIG. 1 comprises spin-orbit torque (SOT) type magnetoresistance effect elements 100 (100a, 100b, 100c, 100d), read control elements 110 (110a, 110b, 110c, 110d; first control elements), element selection control elements 120 (120a, 120b, 120c, 120d; second control elements) and write control elements 130 (130a, 130c; third control elements). The spin-orbit torque type magnetoresistance effect element 100a comprises a magnetoresistance effect element 10a and spin-orbit torque wiring line 20a. The spin-orbit torque type magnetoresistance effect element 100b comprises a magnetoresistance effect element 10b and spin-orbit torque wiring line 20b.

The magnetoresistance effect element 10a comprises a first ferromagnetic metal layer 1 with a fixed magnetization direction, a second ferromagnetic metal layer 2 with a varying magnetization direction and a non-metallic layer 3 sandwiched between the first ferromagnetic metal layer 1 and the second ferromagnetic metal layer 2. The spin-orbit torque wiring line 20a comprises a resistance 21a and a resistance 22a. The magnetoresistance effect element 10b comprises a first ferromagnetic metal layer 1, a second ferromagnetic metal layer 2 and a non-magnetic layer 3. The spin-orbit torque wiring line 20b comprises a resistance 21b and a resistance 22b. Additionally, the spin-orbit torque wiring 20 extends in the second direction (x-direction) that intersects with the z-direction, which is the stacking direction of the magnetoresistance effect element 10, and is joined to the second ferromagnetic metal layer 2. Additionally, in the magnetic memory 200, the long axis on a surface perpendicular to the first direction (z-direction) of the magnetoresistance effect element 10 is aligned with the second direction (x-direction).

In the following explanation, when not referring to a specific spin-orbit torque type magnetoresistance effect element 100a, 100b, 100c or 100d, it shall be referred to simply as a spin-orbit torque type magnetoresistance effect element 100. When not referring to a specific read control element 110a, 110b, 110c or 110d, it shall be referred to simply as a read control element 110. When not referring to a specific element selection control element 120a, 120b, 120c or 120d, it shall be referred to simply as an element selection control element 120. When not referring to a specific write control element 130 (130a, 130c), it shall be referred to simply as a write control element 130. When not referring to a specific magnetoresistance effect element 10a, 10b, it shall be referred to simply as a magnetoresistance effect element 10. When not referring to a specific spin-orbit torque wiring line 20a, 20b, it shall be referred to simply as spin-orbit torque wiring 20.

(Connections in Magnetic Memory 200)

The connections in the magnetic memory 200 will be explained.

The read control element 110a comprises a drain electrode D, a channel C (also known as a gate electrode G) and a source electrode S. The drain electrode D is connected to a terminal connected to a power supply (not shown), the channel C is connected to a terminal connected to a control device (not shown), and the source electrode S is connected to the first ferromagnetic metal layer 1 of the magnetoresistance effect element 10a.

The second ferromagnetic metal layer 2 of the magnetoresistance effect element 10a is joined to the spin-orbit torque wiring line 20a and is connected to an intermediate connection point between the resistance 21a and the resistance 22a.

One end of the resistance 21a (the end portion on the side opposite from the intermediate connection point, hereinafter referred to as the "second connection point") is connected to the source electrode S of the write control element 130a, to the second connection point of the resistance 21b of the spin-orbit torque wiring line 20b provided in the spin-orbit torque type magnetoresistance effect element 100b, and to a terminal connected to a reference potential.

One end of the resistance 22a (the end portion on the side opposite from the intermediate connection point, hereinafter referred to as the "first connection point") is connected to the drain electrode D of the element selection control element 120a.

In the element selection control element 120a, the channel C is connected to a terminal connected to a control device (not shown), and the source electrode S is connected to the source electrode S of the element selection control element 120b and a read terminal for reading data.

In the write control element 130a, the drain electrode D is connected to a terminal connected to a power supply (not shown), and the channel C is connected to a terminal connected to a control device (not shown).

In the read control element 110b, the drain electrode D is connected to a terminal connected to a power supply (not shown), the channel C is connected to a terminal connected to a control device (not shown), and the source electrode S is connected to the first ferromagnetic metal layer 1 of the magnetoresistance effect element 10b.

The second ferromagnetic metal layer 2 of the magnetoresistance effect element 10b is connected to an intermediate point between the resistance 21b and the resistance 22b.

The first connection point of the resistance 22b is connected to the drain electrode D of the element selection control element 120b.

In the element selection control element 120b, the channel C is connected to a terminal connected to a control device (not shown).

The connections between the spin-orbit torque type magnetoresistance effect elements 100 (100c, 100d), the read control elements 110 (110c, 110d), the element selection control elements 120 (120c, 120d) and the write control element 130c are similar to the connections between the spin-orbit torque type magnetoresistance effect elements 100 (100a, 100b), the read control elements 110 (110a, 110b), the element selection control elements 120 (120a, 120b) and the write control element 130a.

The resistance value of a magnetoresistance effect element 10 may be set higher than the resistance value of the spin-orbit torque wiring 20 which contacts the magnetoresistance effect element 10. By using such a configuration, it becomes more difficult for electric current to flow from the spin-orbit torque wiring to the magnetoresistance effect element. As a result thereof, the amount of spin supplied from the spin-orbit torque wiring becomes large and magnetization reversal becomes possible with less current.

Additionally, in the magnetic memory 200, the resistance value of the read control element 110 can be made smaller than the resistance value of the magnetoresistance effect element 10. By using such a configuration, the magnetic resistance (MR) during reading becomes greater, and reading errors can be reduced.

The spin-orbit torque type magnetoresistance effect elements 100 (100a, 100b, 100c, 100d) are magnetoresistance effect elements that make use of spin-orbit torque, and are elements that hold data.

The read control elements 110 (110a, 110b, 110c, 110d), the element selection control elements 120 (120a, 120b, 120c, 120d) and the write control elements 130 (130a, 130c) are each switching elements such as FETs (field-effect transistors).

The circuit diagram shown in FIG. 1 is one example, and the invention is not limited thereto. For example, two or more magnetoresistance effect elements 10 may be arranged in the longitudinal direction, or two or more may be arranged in the lateral direction. For example, there may be three in the lateral direction, and a magnetoresistance effect element 10e and a magnetoresistance effect element 10f may be further provided. In this case, the source electrode S of the write control element 130a is connected to the second ferromagnetic metal layer 2 via the resistance 22 connected to the magnetoresistance effect element 10e, and the source electrode S of the write control element 130b is connected to the second ferromagnetic metal layer 2 via the resistance 22 connected to the magnetoresistance effect element 10f.

(Leak Current During Read Operation, Leak Current During Write Operation)

Next, the operations of the spin-orbit torque type magnetoresistance effect elements 100 (100a, 100b), the read control elements 110 (110a, 110b), the element selection control elements 120 (120a, 120b) and the write control element 130a in the magnetic memory 200 will be explained.

First, an example of the operations when reading data will be explained.

When reading data in the spin-orbit torque type magnetoresistance effect element 100b, the read control element 110b and the element selection control element 120b are controlled to be in the ON state. At this time, the other control elements are in the OFF state. When reading data, electric current can flow from the read control element 110b in the stacking direction of the magnetoresistance effect element 10b, and the change in the resistance value in the magnetoresistance effect element 10b can be read.

In this case, when the current value supplied from the drain of the read control element 110b is 1 mA, a current of 1 mA flows to the magnetoresistance effect element 10b, and most of the current is read from the element selection control element 120b. Approximately 0.13 nA (nanoAmperes) flows to the resistance 21b side of the spin-orbit torque wiring line 20b. Additionally, a leak current of approximately 1.7 pA (picoAmperes) flows to the element selection control element 120a that is adjacent in the lateral direction. In other words, in the magnetic memory 200 of the present embodiment, there is only a slight current leak during reading.

Next, an example of the operations when writing data will be explained.

When writing data into the spin-orbit torque type magnetoresistance effect element 100b, the element selection control element 120b and the write control element 130a are controlled to be in the ON state, and electric current flows from the source of the write control element 130a to the spin-orbit torque wiring line 20b. At this time, the other control elements are in the OFF state. As a result, it is possible to perform magnetization reversal (writing) in the second ferromagnetic metal layer 2 of the magnetoresistance effect element 10b.

In this case, when the current value from the source of the write control element 130a is 1 mA, a current of approximately 1 mA flows in the spin-orbit torque wiring line 20b. The leak current flowing to the element selection control element 120a that is adjacent in the lateral direction is merely about 1.7 pA. In other words, in the magnetic memory 200 of the present embodiment, there is only a slight current leak during writing.

(Integration Density)

Next, we will be explained about the integration density.

In the magnetic memory 200 illustrated in FIG. 1, for example, the write control element 130a spans across multiple spin-orbit torque type magnetoresistance effect elements 100 (100a, 100b), and can be provided as a unit on an end portion of an integrated circuit board or the like. In other words, in the magnetic memory 200 illustrated in FIG. 1, the write control element 130a does not have much influence on the integration properties of the spin-orbit torque type magnetoresistance effect elements 100 (100a, 100b). Therefore, a single unit cell that affects the integration properties of the integrated circuit can be considered to be formed by a single spin-orbit torque type magnetoresistance effect element 100 and two control elements. The two control elements are the read control element 110 and the element selection control element 120 in the magnetic memory 200.

Conventionally, it was thought that three control elements are necessary for each spin-orbit torque type magnetoresistance effect element using SOT. However, depending on the arrangement, it is possible to reduce the number of control elements affecting the integration properties to two.

Next, a configuration example and an arrangement example when forming the magnetic memory 200 as an integrated circuit will be explained.

Figure 2:
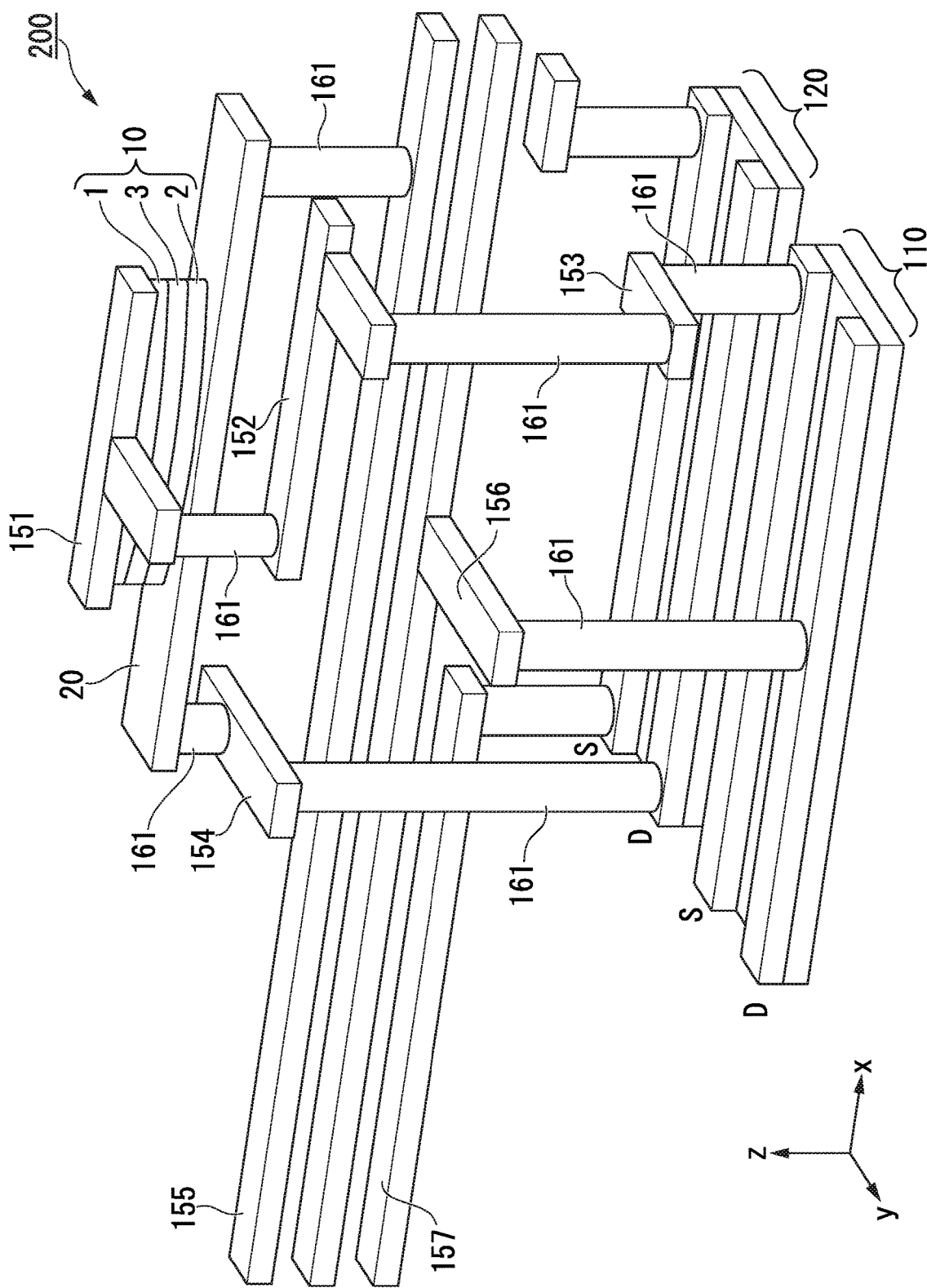
FIG. 2 is a perspective view of a spin-orbit torque type magnetoresistance effect element, a read control element, an element selection control element and spin-orbit torque wiring according to the first embodiment, when arranged three-dimensionally.

FIG. 2 is a perspective view of a spin-orbit torque type magnetoresistance effect element 100, a read control element 110, an element selection control element 120 and spin-orbit torque wiring 20 according to the first embodiment, when arranged three-dimensionally. In FIG. 2, the stacking direction of the magnetoresistance effect element 10 is defined as the z-direction, the first direction in which the spin-orbit torque wiring 20 extends is defined as the x-direction, and the second direction which is orthogonal to both the z-direction and the x-direction is defined as the y-direction. Additionally, in FIG. 2, reference numbers 151 to 157 respectively denote wiring provided in each layer. Additionally, reference number 161 denotes a through-via that connects wiring to wiring.

The arrangement example illustrated in FIG. 2 is merely one example, and the invention is not limited thereto.

As illustrated in FIG. 2, a magnetoresistance effect element 10 is joined to the spin-orbit torque wiring 20.

In the magnetoresistance effect element 10, a first ferromagnetic metal layer 1 is connected to a read control element 110 via wiring 151 to wiring 153, and through-vias 161.

As for the spin-orbit torque wiring 20, one end (first connection point) is connected to the element selection control element 120 via the wiring 154 and a through via 161, and the other end (second connection point) is connected to the wiring 155 via a through-via 161. The wiring 155 is connected to a write control element 130 (FIG. 1).

As illustrated in FIG. 2, the integrated magnetic memory 200 has a read control element 110 and an element selection control element 120 arranged below a magnetoresistance effect element 10 in the z-direction. The integrated magnetic memory 200 has a write control element 130 that is shared between bits. A bit is a unit of information, and in the embodiment, a circuit configuration capable of reading and writing one bit of information is treated as one group.

As illustrated in FIG. 2, the magnetic memory 200 has an element selection control element 120 and a write control element 130 proximately arranged in a third direction (y-direction) intersecting with the first direction (z-direction) and the second direction (x-direction).

In the magnetic memory 200, a maximum electric current flowing in the element selection control elements 120 and the write control elements 130 can be made larger than a maximum electric current flowing in the read control elements 110.

In FIG. 2, the length of the read control element 110 in the x-direction is shown as being the same length as that of the element selection control element 120, but it is sufficient for the length of the read control element 110 in the x-direction to be the sum of the lengths, in the x-direction, of the wiring 156, insulating space, and the wiring 153. For example, if the minimum processing size for the length in the circuit configuration is defined as being F, then the minimum length of a read control element 110 in the x-direction is 3 F. Additionally, the minimum length of a read control element 110 in the y-direction is 3 F. As a result thereof, the read control element 110 can be made smaller than the other control elements.

Next, the size of a single unit cell will be considered.

A single unit cell is defined by one spin-orbit torque type magnetoresistance effect element 100 and two control elements. For this reason, the manner in which these elements are to be arranged is an important problem. Additionally, it is necessary to estimate the element sizes that are necessary for appropriately operating the spin-orbit torque type magnetoresistance effect element 100 and the two control elements.

First, the respective element sizes necessary for appropriately operating the spin-orbit torque type magnetoresistance effect element 100 and the two control elements will be estimated.

In SRAM (Static Random Access Memory) using spin-transfer torque (STT) (hereinafter referred to as "STT-SRAM"), as one example, cylindrical magnetoresistance effect elements having a diameter of 90 nm are used. In this case, the cross-sectional area of a magnetoresistance effect element when viewed from the stacking direction is $(90/2)^2 \times \pi = 6361$ nm$^2$. Magnetoresistance effect elements having cross-sectional areas of this size can stably retain data for 10 years even when subjected to influences such as thermal disturbances.

The cross-sectional area of a magnetoresistance effect element that is necessary for stably retaining data is also about the same for the spin-orbit torque type magnetoresistance effect element 100 according to the present embodiment. For this reason, a cross-sectional area of approximately 6300 nm$^2$ is necessary when a magnetoresistance effect element is viewed from the stacking direction. This cross-sectional area, in a magnetoresistance effect element having a three-dimensional shape of which the length in the x-direction is L1 and the length in the y-direction is L2, corresponds to the value of the "length L1 in the x-direction" multiplied by the "length L2 in the y-direction".

The length L1 in the x-direction and the length L2 in the y-direction can be set to any value. Currently, the smallest processing size (feature size: F) that is possible in a semiconductor is considered to be 7 nm. For this reason, the length L2 in the y-direction must be, at minimum, 7 nm, in which case the length in the x-direction would be 900 nm. Other values could also be set for the length L1 in the x-direction and the length L2 in the y-direction, as shown in Table 1 below. In all cases, "length L2 in the y-direction"× "length L1 in the x-direction"≈6300 nm$^2$, and data can be stably retained.

Table 1 shows the current amounts that are necessary in the magnetoresistance effect element 10 for different lengths L1 in the x-direction and lengths L2 in the y-direction. All of the current amounts are values that are well short of the 400 μA that are necessary for magnetization reversal in STT-SRAM having the same level of data retention performance.

"current density necessary for magnetization reversal" is necessary. For example, if the current amount is 400 μA, then the current density that is necessary for magnetization reversal is 400 μA/6361 nm$^2$=6.2×10$^6$ A/cm$^2$.

In order to rewrite the data in the spin-orbit torque type magnetoresistance effect element 100 according to the present embodiment, an electric current value obtained by multiplying the "current density necessary for magnetization reversal" with the "cross-sectional area (WH) of the spin-orbit torque wiring 20" is necessary.

Since the cross-sectional areas of the magnetoresistance effect elements are the same, the "current density necessary for magnetization reversal" will not significantly differ from the current density that is necessary for magnetization reversal of the magnetoresistance effect elements in STT-SRAM. In other words, it may be 6.2×10$^6$ A/cm$^2$.

Additionally, the "cross-sectional area (WH) of the spin-orbit torque wiring 20" is determined as follows. The width

TABLE 1

| | Spin-Orbit Torque Type Magnetoresistance Effect Element | | | | | | | | | |
|---|---|---|---|---|---|---|---|---|---|---|
| | Magnetoresistance Effect Element | | | | Spin-Orbit Torque Wiring | | | | Control Element | |
| | Width L2 in y-direction (nm) | By Minimum Processing Size (n$_2$F) | Width L1 in x-direction (nm) | By Minimum Processing Size (n$_1$F) | Width (nm) | Thickness (nm) | Cross-sectional Area (nm$^2$) | Reversal Current (μA) | FET Width (nm) | By Minimum Processing Size (n$_3$F) | Integrated Circuit Cell Area (F$^2$) |
| Example 1 | 7 | 1F | 900 | 129F | 7 | 10 | 70 | 4.3 | 8.68 | 2F | 1056 |
| Example 2 | 14 | 2F | 450 | 65F | 14 | 10 | 140 | 8.7 | 17.36 | 3F | 544 |
| Example 3 | 21 | 3F | 300 | 43F | 21 | 10 | 210 | 13.0 | 26.04 | 4F | 368 |
| Example 4 | 28 | 4F | 225 | 33F | 28 | 10 | 280 | 17.4 | 34.72 | 5F | 288 |
| Example 5 | 35 | 5F | 180 | 26F | 35 | 10 | 350 | 21.7 | 43.4 | 7F | 232 |
| Example 6 | 42 | 6F | 150 | 22F | 42 | 10 | 420 | 26.0 | 52.08 | 8F | 200 |
| Example 7 | 49 | 7F | 129 | 19F | 49 | 10 | 490 | 30.4 | 60.76 | 9F | 176 |
| Example 8 | 56 | 8F | 113 | 17F | 56 | 10 | 560 | 34.7 | 69.44 | 10F | 160 |
| Example 9 | 63 | 9F | 100 | 15F | 63 | 10 | 630 | 39.1 | 78.12 | 12F | 144 |
| Example 10 | 70 | 10F | 90 | 13F | 70 | 10 | 700 | 43.4 | 86.8 | 13F | 128 |
| Example 11 | 77 | 11F | 82 | 12F | 77 | 10 | 770 | 47.7 | 95.48 | 14F | 136 |

Additionally, as shown in Table 1, in a spatial configuration necessary for storing one bit of information, when defining a unit of the minimum processing size for the length in the circuit configuration to be F, the maximum value of the area of a surface extending in the second direction (x-direction) and the third direction (y-direction) necessary for the circuit configuration is 1056 F$^2$. Additionally, it was assumed that the magnetoresistance effect element could be reduced to the smallest size for which elements can be microfabricated, in which case the magnetoresistance effect elements can be fabricated at a size of 1 F$^2$. The minimum size to which a control element can be fabricated is 3 F$^2$, and at least two control elements are necessary. Thus, 7 F$^2$ is necessary in the direction of arrangement of the control elements. As regions for providing separation between the constituent cells, at least 1 F$^2$ is necessary in both the second direction (x-direction) and the third direction (y-direction), so the spatial configuration necessary for storing one bit of information is (1+1)×(7+1) F$^2$, so 16 F$^2$ is necessary. In other words, the minimum value for the area of a surface extending in the second direction (x-direction) and the third direction (y-direction) is 16 F$^2$.

On the other hand, in order to allow use as a memory element, the data must be capable of being rewritten.

In order to reverse the magnetization of (rewrite the data in) a magnetoresistance effect element in STT-SRAM, a current amount obtained by multiplying the "cross-sectional area of the magnetoresistance effect element" with the W of the spin-orbit torque wiring 20 must be at least the length L2 of the magnetoresistance effect element 10 in the y-direction. The thickness H of the spin-orbit torque wiring 20 must be approximately 10 nm in order to supply enough electric current, although this depends also on the width W of the spin-orbit torque wiring 20.

In other words, the minimum electric current that is necessary to rewrite the data in the spin-orbit torque type magnetoresistance effect element 100 according to the present embodiment is a value obtained by multiplying the "length L2 in the y-direction (=width W of the spin-orbit torque wiring 20)" and the "thickness H of the spin-orbit torque wiring 20" to the "current density necessary for magnetization reversal".

On the other hand, the electric current necessary for magnetization reversal is controlled by means of the respective control elements. In other words, each control element must have the ability to supply the electric current necessary for magnetization reversal. In other words, the element size necessary for each control element can be estimated from the current amount necessary for magnetization reversal.

Figure 3:
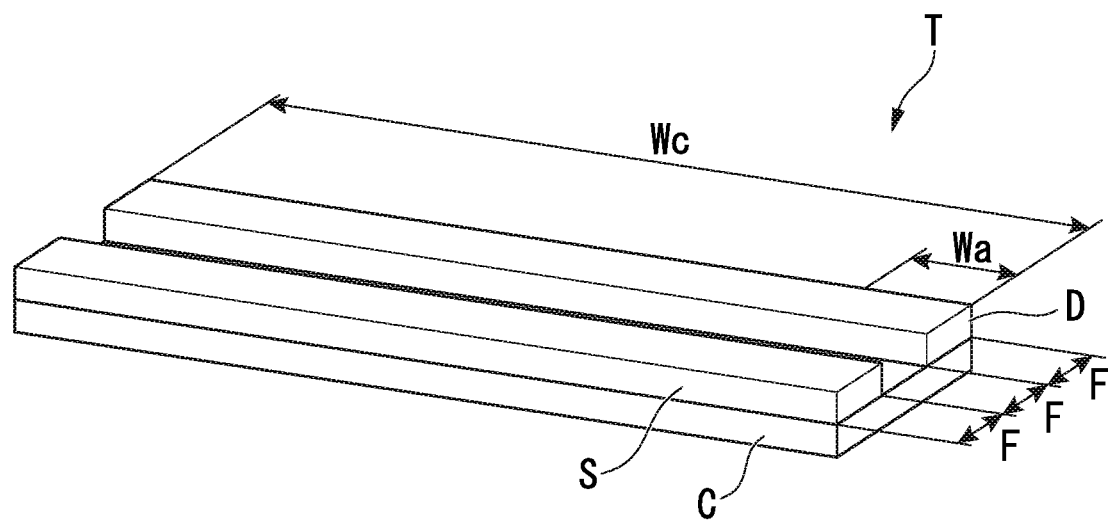
FIG. 3 is a schematic perspective view illustrating a main portion of a control element used in the spin-orbit torque type magnetoresistance effect element according to the first embodiment.

FIG. 3 is a schematic perspective view illustrating a main portion of a control element used in the spin-orbit torque type magnetoresistance effect element according to the first embodiment. Since the same element may be used for the read control element 110, the element selection control element 120 and the write control element 130, the element shall be explained hereinbelow as a control element T. As illustrated in FIG. 3, the control element T comprises a source electrode S, a drain electrode D and a channel C.

If the width of the source electrode S, the width of the drain electrode D and the distance between the source electrode S and the drain electrode D are fixed at the minimum processing size F, then a predetermined current amount per unit width Wa that can be supplied between the source electrode S and the drain electrode D can be determined. When the unit width is 1 µm, an example of the predetermined current amount would be 0.5 mA. In this case, if the reversal current that is necessary for magnetization reversal is 4 µA as in Example 1 shown in Table 1, then the width Wc of the control element must be at least 8 µm. Table 1 also shows the widths Wc of the control element that are necessary in other examples.

As mentioned above, it is possible to estimate the respective element sizes that are necessary for appropriately operating a spin-orbit torque type magnetoresistance effect element 100 and two control elements T. Next, the manner in which one spin-orbit torque type magnetoresistance effect element 100 and two control elements T are to be arranged will be considered.

Figure 4:
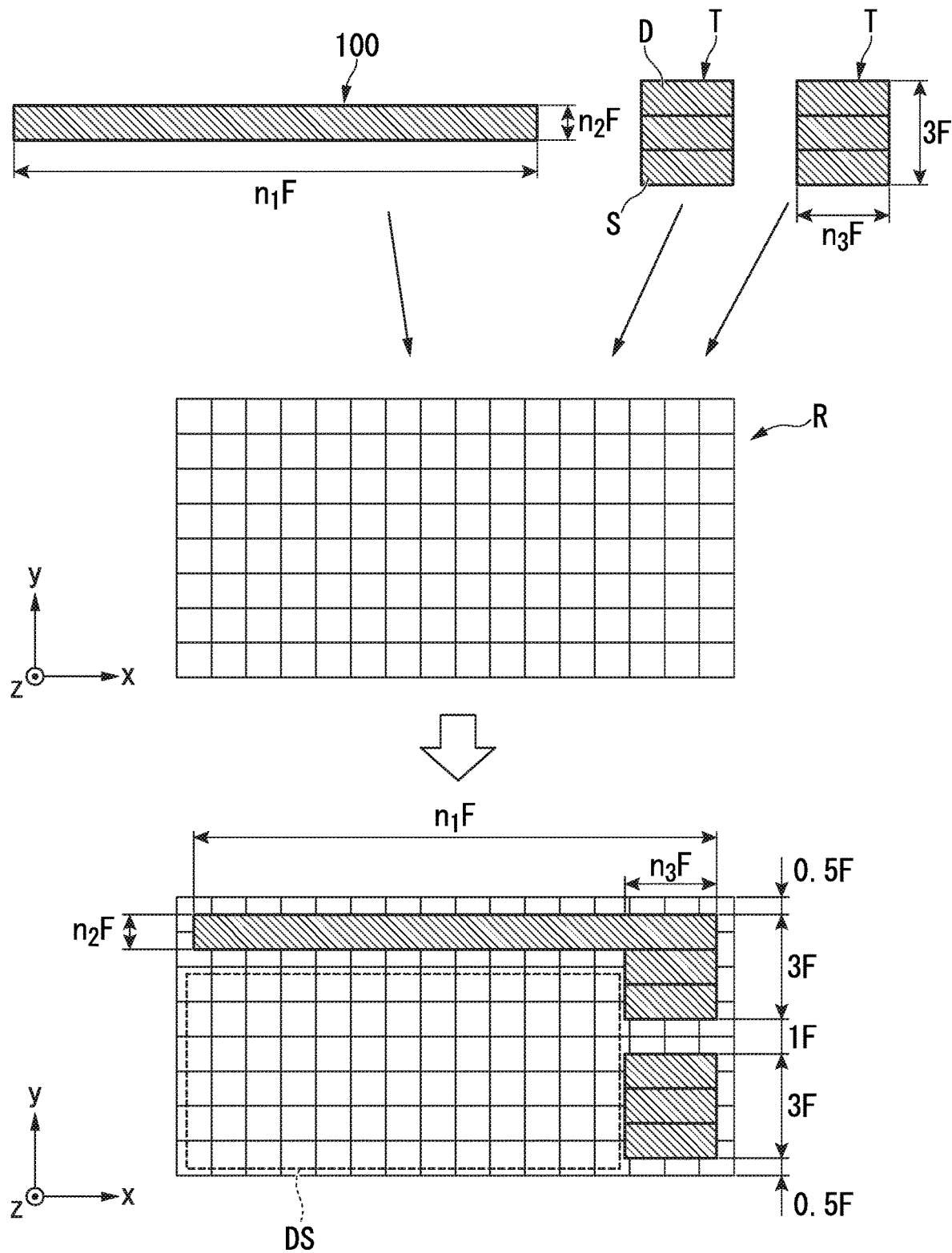
FIG. 4 is a diagram for explaining the cell size necessary for arranging one spin-orbit torque type magnetoresistance effect element and two control elements according to the first embodiment.

FIG. 4 is a diagram for explaining the cell size necessary for arranging one spin-orbit torque type magnetoresistance effect element according to the first embodiment and two control elements.

Expressing the size of the spin-orbit torque type magnetoresistance effect element 100 in terms of the minimum processing size, the length L1 in the x-direction is $n_1F$ and the length L2 in the y-direction is $n_2F$. Although $n_1$ and $n_2$ are designable values, they are correlated as shown in Table 1.

On one hand, the length of one side of a control element T must be 3 F in order to be able to accommodate the width of the source electrode, the width of the drain electrode and the channel region between the source electrode and the drain electrode. On the other hand, the length $n_3F$ of the other side is determined by the current amount to be supplied to the channel C (see Table 1).

These elements are disposed inside a predetermined region R. The spin-orbit torque type magnetoresistance effect element 100 and the control elements T do not need to be processed so as to lie on the same plane, and they may overlap when viewed from the z-direction. In contrast, the control elements T are proximately arranged in parallel in the y-direction in order to route the wiring or the like.

A space is needed between adjacent elements that are present on the same plane in order to avoid short circuits between the elements. This space must have a gap of at least the minimum processing size F. Thus, a width of at least 8 F is necessary in the y-direction for a unit cell in the integrated circuit. In other words, in a spatial configuration necessary for storing one bit of information, if a unit of the minimum processing size for the length in the circuit configuration is defined as F, then the length in the third direction (y-direction) is 8 F.

In the x-direction of the unit cell in the integrated circuit, the size must be at least as large as either the length ($n_1F$) of the spin-orbit torque type magnetoresistance effect element 100 in the x-direction or the length ($n_3F$) of the control element T in the x-direction. In actual practice, spaces (2 F) for fabricating through-vias and a space (1 F) for separating adjacent elements are required, so the width must be at least 3 F added to either the length ($n_1F$) of the spin-orbit torque type magnetoresistance effect element 100 in the x-direction or the length ($n_3F$) of the control element T in the x-direction, whichever is greater.

As shown in Table 1, in most cases apart from Example 11, the length ($n_1F$) of the spin-orbit torque type magnetoresistance effect element 100 in the x-direction determines the size necessary in the x-direction for a unit cell in an integrated circuit.

Thus, the cell area necessary for a unit cell in the integrated circuit is 8 F×{($n_1F$ or $n_3F$)+3}. In this case, the larger of "$n_1F$ or $n_3F$" is chosen. The cell areas that are necessary for different shapes of the magnetoresistance effect element are shown in Table 1.

Figure 5:
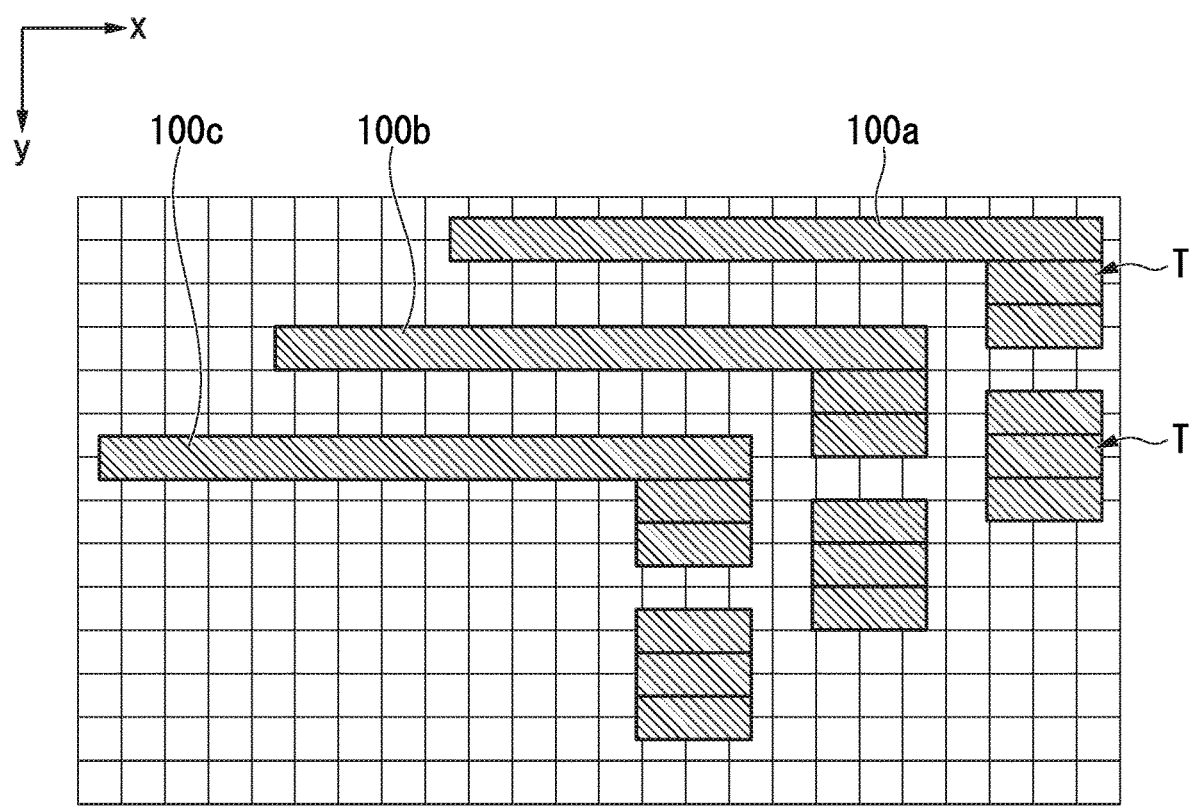
FIG. 5 is a diagram illustrating an arrangement for raising the integration properties of a spin-orbit torque type magnetoresistance effect element according to the first embodiment.

The cell area becomes larger as the difference between the width L1 ($n_1F$) of the magnetoresistance effect element 10 in the x-direction and the width ($n_3F$) of the control element T in the x-direction becomes greater. This is because, as illustrated in FIG. 4, the dead space DS in which no elements are formed increases. In other words, for the purposes of integration, it is preferable for the difference between the width L1 ($n_1F$) of the magnetoresistance effect element 10 in the x-direction and the length ($n_3F$) of the control element T in the x-direction to be smaller. As illustrated in FIG. 5, the level of integration can be increased by arranging the spin-orbit torque type magnetoresistance effect element 100 and the control elements T so as to fill in the dead space DS.

FIG. 5 is a diagram illustrating an arrangement for improving the integration properties of the spin-orbit torque type magnetoresistance effect element according to the first embodiment. The example illustrated in FIG. 5 is an example in which three sets of spin-orbit-torque type magnetoresistance effect elements 100 and control elements T are arranged.

As illustrated in FIG. 5, in the magnetic memory 200, the magnetoresistance effect elements 10 may be arranged at equidistant intervals in the second direction (x-direction) and/or the third direction (y-direction). As a result, according to the present embodiment, it is possible to achieve high-density integration.

Additionally, as illustrated in FIG. 5, in the magnetic memory 200, the regions necessary to store one bit of information may be proximately arranged at equidistant intervals in the second direction (x-direction). As a result, according to the present embodiment, the integration density can be increased.

Additionally, as illustrated in FIG. 5, in the magnetic memory 200, the regions necessary to store one bit of information may be proximately arranged at equidistant intervals in the third direction (y-direction). As a result, according to the present embodiment, the integration density can be increased.

Figure 6:
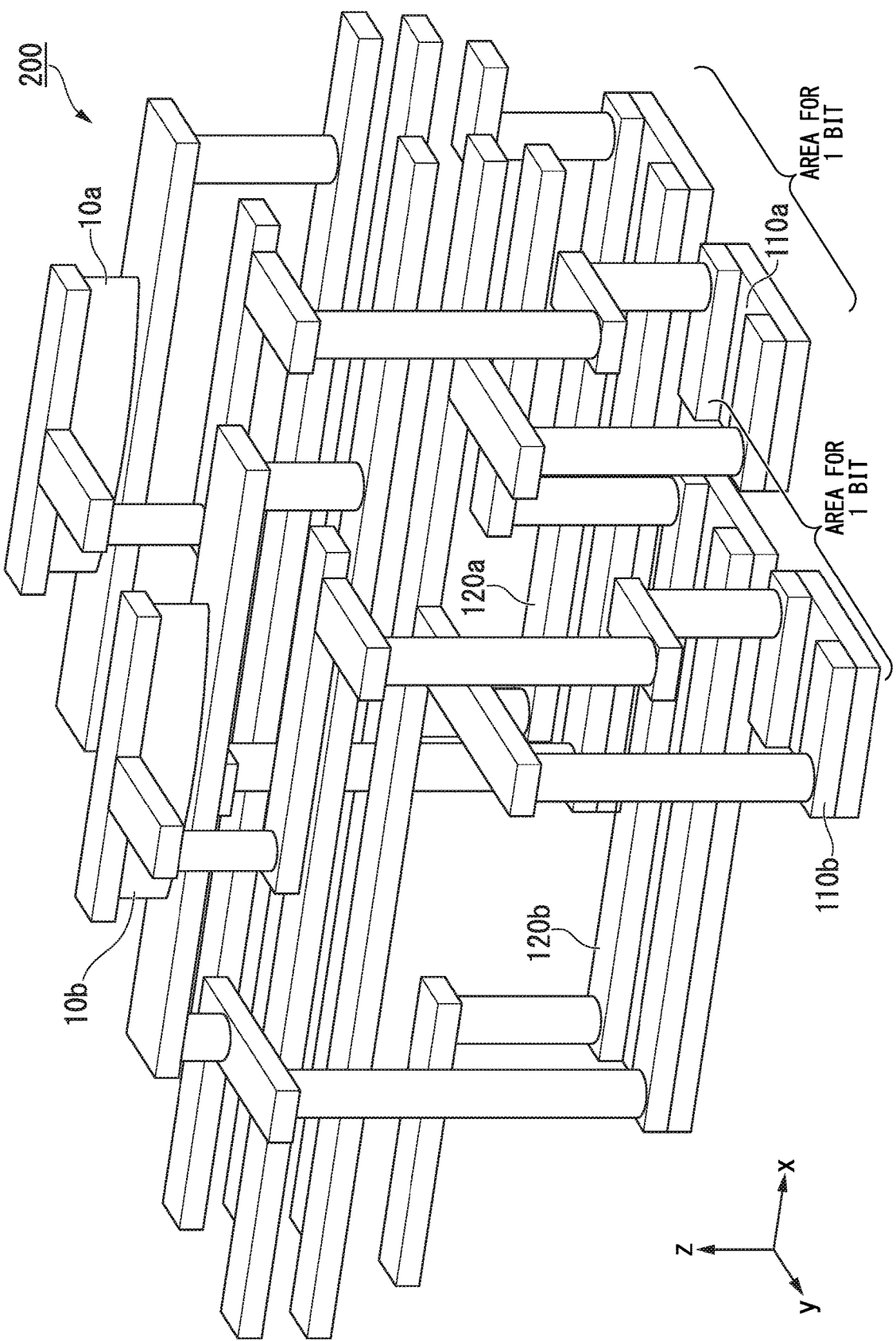
FIG. 6 is an image diagram of the arrangement of an integrated circuit equivalent to two bits in a magnetic memory according to an embodiment.

FIG. 6 is an image diagram of the arrangement of an integrated circuit equivalent to two bits in a magnetic memory according to an embodiment. The coordinate system in FIG. 6 is the same as that in FIG. 2. FIG. 2 illustrates, as an image diagram, an example of the arrangement of integrated circuits equivalent to two bits based on the circuits relating to the magnetoresistance effect element 10a and the magnetoresistance effect element 10b among the circuits illustrated in FIG. 1.

As illustrated in FIG. 6, it is shown that the wiring, through-vias and control elements can be arranged in the dead space in the space for each layer. By using such an arrangement, it is possible to provide an arrangement as explained in FIG. 5 when viewed in the x-y plane.

Additionally, the example illustrated in FIG. 6 is also an example in which the size of the read control element 110 is greater than the size of the element selection control elements 120.

Additionally, as the control elements in FIG. 6, the element selection control element 120 and the write control element 130 are incorporated into a unit cell, and the structure follows the circuit diagram in FIG. 1. As illustrated in FIG. 6, the wiring that connects the three control elements is routed without resulting in any short circuits. In other words, it can be seen that the arrangement of the control elements illustrated in FIG. 5 is also possible when taking the three-dimensional structure into account. It was also confirmed that a three-dimensional structure is possible when following the circuit diagram in FIG. 1 (not shown in perspective).

Meanwhile, in order to make the reversal current amount smaller, it is preferable to make the width L2 ($n_2F$) of the magnetoresistance effect element 10 in the y-direction smaller, even if the difference between the width L1 ($n_2F$) of the magnetoresistance effect element 10 in the x-direction and the width ($n_3F$) of the control element T in the x-direction becomes greater.

The results of a similar analysis when assuming the minimum processing size F to be 10 nm are shown in Table 2, and the results of a similar analysis when assuming the minimum processing size F to be 28 nm are shown in Table 3. Results similar to those in Table 1 were also able to be confirmed in Tables 2 and 3.

In Comparative Examples 1-5 (Table 3), the width L2 of the magnetoresistance effect element in the y-direction is greater than the width L1 in the x-direction, and a large reversal current amount is necessary for magnetization reversal. Additionally, the width of the cell area of the integrated circuit in the x-direction is dependent on the size of the control elements, and the level of integration is made worse.

Additionally, the examples shown in Table 1 to Table 3 were calculated under conditions in which information (data) can be continuously retained for 10 years.

When MRAM is to be used as a cache or the like, the time of retention of the information is short. For this reason, as one example, an example in which the time of retention of the information is 1 second is shown in Tables 4 to 6.

Table 4 is a table showing the current amounts necessary for different lengths L1 of the magnetoresistance effect element 10 in the x-direction and lengths L2 in the y-direction, in the case where the information retention time is 1 second. In Table 4, the minimum processing size F is 7 nm, and the table corresponds to Table 1. All of the current amounts are values that are well short of the 400 μA necessary for magnetization reversal in STT-MRAM having the same level of data retention performance.

TABLE 2

| | Spin-Orbit Torque Type Magnetoresistance Effect Element | | | | | | | | | |
|---|---|---|---|---|---|---|---|---|---|---|
| | Magnetoresistance Effect Element | | | | Spin-Orbit Torque Wiring | | | | Control Element | |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Integrated Circuit Cell Area ($F^2$) |
| Example 12 | 10 | 1F | 630 | 63F | 10 | 10 | 100 | 6.2 | 12.4 | 2F | 528 |
| Example 13 | 20 | 2F | 315 | 32F | 20 | 10 | 200 | 12.4 | 24.8 | 3F | 280 |
| Example 14 | 30 | 3F | 210 | 21F | 30 | 10 | 300 | 18.6 | 37.2 | 4F | 192 |
| Example 15 | 40 | 4F | 158 | 16F | 40 | 10 | 400 | 24.8 | 49.6 | 5F | 152 |
| Example 16 | 50 | 5F | 126 | 13F | 50 | 10 | 500 | 31 | 62 | 7F | 128 |
| Example 17 | 60 | 6F | 105 | 11F | 60 | 10 | 600 | 37.2 | 74.4 | 8F | 112 |
| Example 18 | 70 | 7F | 90 | 9F | 70 | 10 | 700 | 43.4 | 86.8 | 9F | 96 |

TABLE 3

| | Spin-Orbit Torque Type Magnetoresistance Effect Element | | | | | | | | | |
|---|---|---|---|---|---|---|---|---|---|---|
| | Magnetoresistance Effect Element | | | | Spin-Orbit Torque Wiring | | | | Control Element | |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Integrated Circuit Cell Area ($F^2$) |
| Example 19 | 28 | 1F | 225 | 9F | 28 | 10 | 280 | 17.4 | 34.7 | 2F | 80 |
| Example 20 | 56 | 2F | 113 | 4F | 56 | 10 | 560 | 34.7 | 69.4 | 3F | 40 |
| Comparative Example 1 | 84 | 3F | 75 | 3F | 84 | 10 | 840 | 52 | 104.16 | 4F | 56 |
| Comparative Example 2 | 112 | 4F | 56 | 3F | 112 | 10 | 1120 | 69 | 138.88 | 5F | 64 |
| Comparative Example 3 | 140 | 5F | 45 | 2F | 140 | 10 | 1140 | 87 | 173.6 | 7F | 80 |
| Comparative Example 4 | 168 | 6F | 38 | 2F | 168 | 10 | 1680 | 104 | 208.32 | 8F | 88 |
| Comparative Example 5 | 196 | 7F | 32 | 2F | 196 | 10 | 1960 | 122 | 243.04 | 9F | 96 |

TABLE 4

| | Spin-Orbit Torque Type Magnetoresistance Effect Element | | | | | | | | | | |
|---|---|---|---|---|---|---|---|---|---|---|---|
| | Magnetoresistance Effect Element | | | | Spin-Orbit Torque Wiring | | | | Control Element | | |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Integrated Circuit Cell Area ($F^2$) |
| Example 21 | 7 | 1F | 600 | 86F | 7 | 10 | 70 | 4.3 | 8.68 | 2F | 712 |
| Example 22 | 14 | 2F | 300 | 43F | 14 | 10 | 140 | 8.7 | 17.36 | 3F | 368 |
| Example 23 | 21 | 3F | 200 | 29F | 21 | 10 | 210 | 13.0 | 26.04 | 4F | 256 |
| Example 24 | 28 | 4F | 150 | 22F | 28 | 10 | 280 | 17.4 | 34.72 | 5F | 200 |
| Example 25 | 35 | 5F | 120 | 18F | 35 | 10 | 350 | 21.7 | 43.4 | 7F | 168 |
| Example 26 | 42 | 6F | 100 | 15F | 42 | 10 | 420 | 26.0 | 52.08 | 8F | 144 |
| Example 27 | 49 | 7F | 86 | 13F | 49 | 10 | 490 | 30.4 | 60.76 | 9F | 128 |
| Example 28 | 56 | 8F | 75 | 11F | 56 | 10 | 560 | 34.7 | 69.44 | 10F | 126 |
| Example 29 | 63 | 9F | 67 | 10F | 63 | 10 | 630 | 39.1 | 78.12 | 12F | 140 |
| Example 30 | 70 | 10F | 60 | 9F | 70 | 10 | 700 | 43.4 | 86.8 | 13F | 165 |

Table 5 is a table showing the current amounts necessary for different lengths L1 of the magnetoresistance effect element 10 in the x-direction and lengths L2 in the y-direction, in the case where the information retention time is 1 second. In Table 5, the minimum processing size F is 10 nm, and the table corresponds to Table 2.

TABLE 5

| | Spin-Orbit Torque Type Magnetoresistance Effect Element | | | | | | | | | | |
|---|---|---|---|---|---|---|---|---|---|---|---|
| | Magnetoresistance Effect Element | | | | Spin-Orbit Torque Wiring | | | | Control Element | | |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Integrated Circuit Cell Area ($F^2$) |
| Example 31 | 10 | 1F | 420 | 42F | 10 | 10 | 100 | 6.2 | 12.4 | 2F | 360 |
| Example 32 | 20 | 2F | 210 | 21F | 20 | 10 | 200 | 12.4 | 24.8 | 3F | 192 |
| Example 33 | 30 | 3F | 140 | 14F | 30 | 10 | 300 | 18.6 | 37.2 | 4F | 136 |
| Example 34 | 40 | 4F | 105 | 11F | 40 | 10 | 400 | 24.8 | 49.6 | 5F | 112 |
| Example 35 | 50 | 5F | 84 | 9F | 50 | 10 | 500 | 31 | 62 | 7F | 96 |
| Example 36 | 60 | 6F | 70 | 7F | 60 | 10 | 600 | 37.2 | 74.4 | 8F | 88 |
| Example 37 | 70 | 7F | 960 | 6F | 70 | 10 | 700 | 43.4 | 86.8 | 9F | 96 |

Table 6 is a table showing the current amounts necessary for different lengths L1 of the magnetoresistance effect element 10 in the x-direction and lengths L2 in the y-direction, in the case where the information retention time is 1 second. In Table 6, the minimum processing size F is 28 nm, and the table corresponds to Table 3. Results similar to those in Table 4 were also able to be confirmed in Tables 5 and 6.

TABLE 6

| | Spin-Orbit Torque Type Magnetoresistance Effect Element | | | | | | | | | | |
|---|---|---|---|---|---|---|---|---|---|---|---|
| | Magnetoresistance Effect Element | | | | Spin-Orbit Torque Wiring | | | | Control Element | | |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Integrated Circuit Cell Area ($F^2$) |
| Example 38 | 28 | 1F | 150 | 6F | 28 | 10 | 280 | 17.4 | 34.7 | 2F | 72 |
| Example 39 | 56 | 2F | 75 | 3F | 56 | 10 | 560 | 34.7 | 69.4 | 3F | 48 |
| Comparative Example 6 | 84 | 3F | 50 | 2F | 84 | 10 | 840 | 52 | 104.16 | 4F | 56 |
| Comparative Example 7 | 112 | 4F | 38 | 2F | 112 | 10 | 1120 | 69 | 138.88 | 5F | 64 |

TABLE 6-continued

| | Spin-Orbit Torque Type Magnetoresistance Effect Element | | | | | | | | | | |
|---|---|---|---|---|---|---|---|---|---|---|---|
| | Magnetoresistance Effect Element | | | | Spin-Orbit Torque Wiring | | | | Control Element | | |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (μA) | FET Width (nm) | By Minimum Processing Size ($n_3F$) | Integrated Circuit Cell Area ($F^2$) |
| Comparative Example 8 | 140 | 5F | 30 | 2F | 140 | 10 | 1140 | 87 | 173.6 | 7F | 80 |
| Comparative Example 9 | 168 | 6F | 25 | 1F | 168 | 10 | 1680 | 104 | 208.32 | 8F | 88 |
| Comparative Example 10 | 196 | 7F | 21 | 1F | 196 | 10 | 1960 | 122 | 243.04 | 9F | 96 |

As described above, the magnetic memory 200 according to the present embodiment comprises a plurality of magnetoresistance effect elements 10 that hold information (data), each comprising a first ferromagnetic metal layer 1 with a fixed magnetization direction, a second ferromagnetic metal layer 2 with a varying magnetization direction, and a nonmagnetic layer 3 sandwiched between the first ferromagnetic metal layer 1 and the second ferromagnetic metal layer 2; a plurality of first control elements (read control elements 110) that control reading of the information, wherein each of the plurality of first ferromagnetic metal layers 1 is connected to a first control element; a plurality of spin-orbit torque wiring lines 20 that extend in a second direction (x-direction) intersecting with a first direction (z-direction) which is a stacking direction of the magnetoresistance effect elements 10, wherein each of the second ferromagnetic metal layers 2 is joined to one spin-orbit torque wiring line 20; a plurality of second control elements (element selection control elements 120) that control electric current flowing through the spin-orbit torque wiring lines 20, wherein a first connection point (the other end of the resistance 22) in each of the spin-orbit torque wiring lines 20 is connected to one second control element; and a third control element (write control element 130) that controls writing of the information, connected to a second connection point (the other end of the resistance 21) in each of the plurality of spin-orbit torque wiring lines 20.

Due to this configuration, the magnetic memory 200 of the present embodiment is able to lower the reversal current. As a result, according to the present embodiment, the integration density can be increased.

Additionally, in the magnetic memory 200A of the present embodiment, electric current will not tend to flow from the spin-orbit torque wiring to the magnetoresistance effect elements, and the spin amount that is supplied from the spin-orbit torque wiring layer is large, so that magnetization reversal is possible even with a small current.

Additionally, in the magnetic memory 200 of the present embodiment, the magnetic resistance during reading can be made large, and reading errors can be reduced.

Additionally, in the magnetic memory 200 of the present embodiment, the number of control elements affecting the integration properties can be held to just two. As a result thereof, according to the present embodiment, the integration density can be increased.

Additionally, in the magnetic memory 200 of the present embodiment, the read control elements 110 can be made smaller than the other control elements. As a result, according to the present embodiment, the integration density can be increased.

Second Embodiment

In the first embodiment, an example in which the write control elements 130, when viewed as a matrix, are shared by a plurality of spin-orbit torque type magnetoresistance effect elements 100 that are arranged in the lateral direction, has been explained. In the present embodiment, an example in which the read control elements 110, when viewed as a matrix, are shared by a plurality of spin-orbit torque type magnetoresistance effect elements 100 that are arranged in the longitudinal direction, will be explained.

Figure 7:
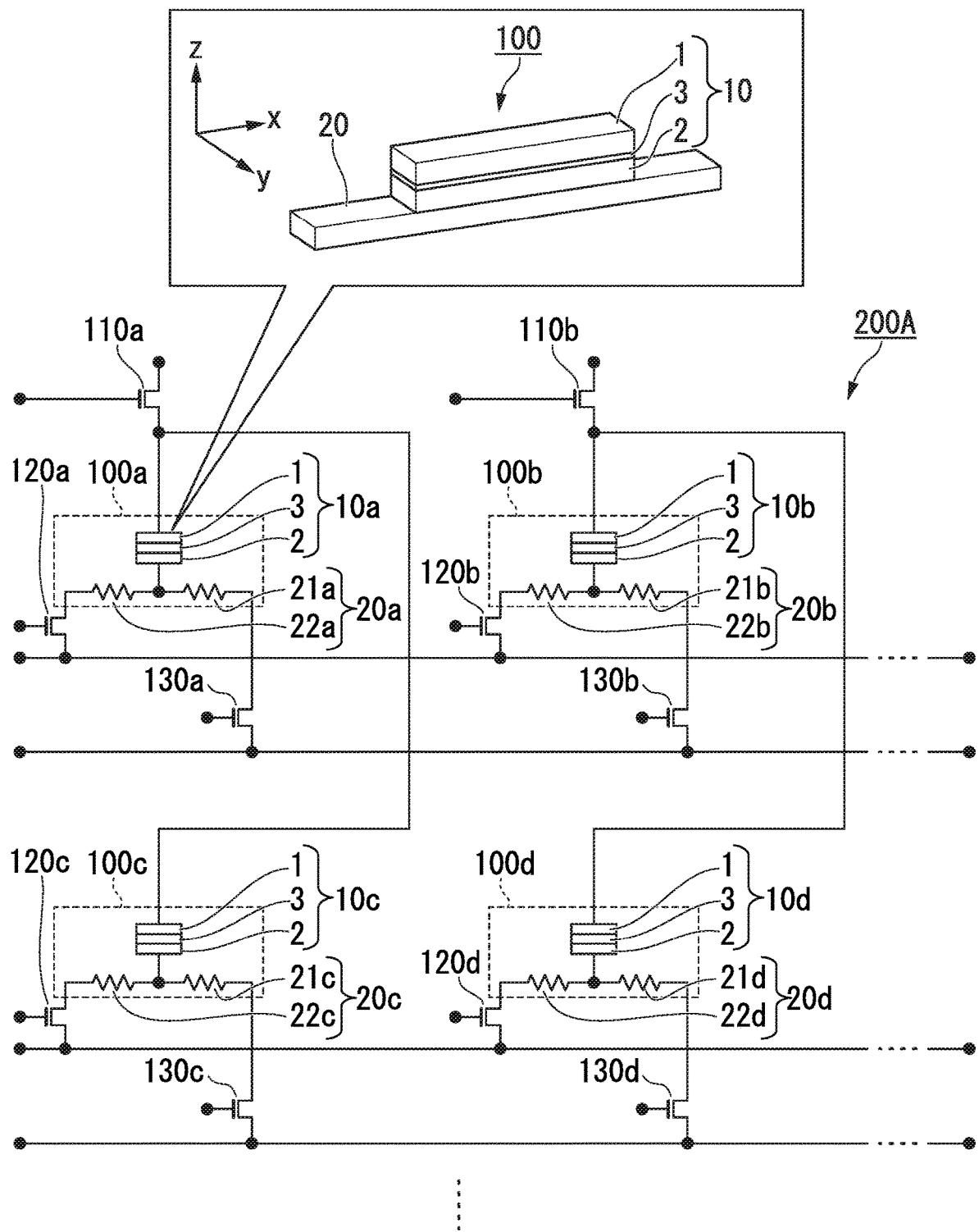
FIG. 7 is a circuit diagram of an example of a magnetic memory in accordance with a second embodiment.

FIG. 7 is a circuit diagram of an example of a magnetic memory 200A according to the second embodiment. In FIG. 7, the stacking direction of the magnetoresistance effect element 10 is defined as the z-direction, the first direction in which the spin-orbit torque wiring 20 extends is defined as the x-direction, and the second direction which is orthogonal to both the z-direction and the x-direction is defined as the y-direction.

The magnetic memory 200A illustrated in FIG. 7 comprises spin-orbit torque type magnetoresistance effect elements 100 (100a, 100b, 100c, 100d), read control elements 110 (110a, 110b; first control elements), element selection control elements 120 (120a, 120b, 120c, 120d; second control elements) and write control elements 130 (130a, 130b, 130c, 130d; third control elements). The spin-orbit torque type magnetoresistance effect element 100a comprises a magnetoresistance effect element 10a and a spin-orbit torque wiring line 20a. The spin-orbit torque type magnetoresistance effect element 100b comprises a magnetoresistance effect element 10b and a spin-orbit torque wiring line 20b. The functional units having the same functions as in the magnetic memory 200 of the first embodiment will be denoted by using the same reference signs. The spin-orbit torque wiring 20 extends in a second direction (x-direction) that intersects with the first direction (z-direction), which is the stacking direction of a magnetoresistance effect element 10, and is joined with the second ferromagnetic metal layer 2. In the magnetic memory 200A, the long axis on the surface perpendicular to the first direction (z-direction) of the magnetoresistance effect element 10 is the second direction (x-direction).

(Connections in Magnetic Memory 200A)

The connections in the magnetic memory 200A will be explained.

The read control element 110a comprises a drain electrode D, a channel C and a source electrode S. The drain electrode D is connected to a terminal connected to a power supply (not shown), the channel C is connected to a terminal connected to a control device (not shown), and the source electrode S is connected to the first ferromagnetic metal layer 1 of the magnetoresistance effect element 10*a* and the first ferromagnetic metal layer 1 of the magnetoresistance effect element 10*c*.

The second ferromagnetic metal layer 2 of the magnetoresistance effect element 10*a* is joined to the spin-orbit torque wiring line 20*a* and is connected between the resistance 21*a* and the resistance 22*a*.

The second connection point of the resistance 21*a* is connected to the source electrode S of the write control element 130*a*.

The first connection point of the resistance 22*a* is connected to the drain electrode D of the element selection control element 120*a*.

In the element selection control element 120*a*, the channel C is connected to a terminal connected to a control device (not shown), and the source electrode S is connected to the source electrode S of the element selection control element 120*b* and to a read terminal that reads data.

In the write control element 130*a*, the drain electrode D is connected to the drain electrode D of the write control element 130*b* and to a terminal connected to a power supply (not shown), and the channel C is connected to a terminal connected to a control device (not shown).

In the read control terminal 110*b*, the drain electrode D is connected to a terminal connected to a power supply (not shown), the channel C is connected to a terminal connected to a control device (not shown), and the source electrode S is connected to the first ferromagnetic metal layer 1 of the magnetoresistance effect element 10*b* and to the first ferromagnetic metal layer 1 of the magnetoresistance effect element 10*d*.

The second ferromagnetic metal layer 2 of the magnetoresistance effect element 10*b* is joined to the spin-orbit torque wiring line 20*b* and is connected to the intermediate connection point between the resistance 21*b* and the resistance 22*b*.

The second connection point of the resistance 21*b* is connected to the source electrode S of the write control element 130*b*.

The first connection point of the resistance 22*b* is connected to the drain electrode D of the element selection control element 120*b*.

In the element selection control element 120*b*, the channel C is connected to a terminal connected to a control device (not shown).

In the write control element 130*b*, the channel C is connected to a terminal connected to a control device (not shown).

The second ferromagnetic metal layer 2 of the magnetoresistance effect element 10*c* is joined to the spin-orbit torque wiring line 20*c* and is connected to the intermediate connection point between the resistance 21*c* and the resistance 22*c*.

The second connection point of the resistance 21*c* is connected to the source electrode S of the write control element 130*c*.

The first connection point of the resistance 22*c* is connected to the drain electrode D of the element selection control element 120*c*.

In the element selection control element 120*c*, the channel C is connected to a terminal connected to the control device (not shown), and the source electrode S is connected to the source electrode S of the element selection control element 120*d* and to a read terminal that reads data.

In the write control element 130*c*, the drain electrode D is connected to the drain electrode D of the write control element 130*d* and to a terminal connected to a power supply (not shown), and the channel C is connected to a terminal connected to a control device (not shown).

The second ferromagnetic metal layer 2 of the magnetoresistance effect element 10*d* is joined to the spin-orbit torque wiring 20*d* and to the intermediate connection point between the resistance 21*d* and the resistance 22*d*.

The second connection point of the resistance 21*d* is connected to the source electrode S of the write control element 130*d*.

The first connection point of the resistance 22*d* is connected to the drain electrode D of the element selection control element 120*d*.

In the element selection control element 120*d*, the channel C is connected to a terminal connected to a control device (not shown).

In the write control element 130*d*, the channel C is connected to a terminal connected to a control device (not shown).

The resistance value of the magnetoresistance effect element 10 may be higher than the resistance value of the spin-orbit torque wiring 20 that contacts the magnetoresistance effect element 10. By using such a configuration, electric current will not tend to flow from the spin-orbit torque wiring to the magnetoresistance effect element. As a result thereof, the spin amount that is supplied from the spin-orbit torque wiring layer is large, so that magnetization reversal is possible even with a small current.

Additionally, in the magnetic memory 200, the resistance value of the read control element 110 can be made lower than the resistance value of the magnetoresistance effect element 10. By using such a configuration, it is possible to make the magnetic resistance during reading large, thereby reducing reading errors.

The circuit diagram shown in FIG. 7 is one example, and the invention is not limited thereto. For example, there may be two or more magnetoresistance effect elements 10 in the longitudinal direction, or there may be two or more in the lateral direction. For example, there may be three in the longitudinal direction, and a magnetoresistance effect element 10*e* and a magnetoresistance effect element 10*f* may be further provided. In this case, the source electrode S of the read control element 110*a* is connected to the first ferromagnetic metal layer 1 of the magnetoresistance effect element 10*e* and the source electrode S of the read control element 110*b* is connected to the first ferromagnetic metal layer 1 of the magnetoresistance effect element 10*f*.

(Leak Current During Read Operation, Leak Current During Write Operation)

Next, the operations of the spin-orbit torque type magnetoresistance effect elements 100 (100*a*, 100*b*), the read control elements 110 (110*a*, 110*b*), the element selection control elements 120 (120*a*, 120*b*) and the write control elements 130 (130*a*, 130*b*) in the magnetic memory 200A will be explained.

First, an example of the operations when reading data will be explained.

When reading data in the spin-orbit torque type magnetoresistance effect element 100*b*, the read control element 110*b* and the element selection control element 120*b* are controlled to be in the ON state. At this time, the other control elements are in the OFF state. When reading data, electric current can flow from the read control element 110*b* in the stacking direction of the magnetoresistance effect element 10*b*, and the change in the resistance value in the magnetoresistance effect element 10*b* can be read.

In this case, when the current value supplied from the drain of the read control element 110b is 1 mA, an electric current of approximately 1 mA flows to the magnetoresistance effect element 10b, in which the element selection control element 120b is in the ON state, and no current flows to the magnetoresistance effect element 10d, in which the element selection control element 120d is in the OFF state. For this reason, the leak current to the element selection control element 120a which is adjacent to the element selection control element 120b in the lateral direction is approximately 0 A. In other words, in the magnetic memory 200A of the present embodiment, the current leakage during reading is approximately 0 A.

Next, an example of the operations when writing data will be explained.

When writing data into the spin-orbit torque type magnetoresistance effect element 100b, the element selection control element 120b and the write control element 130b are controlled to be in the ON state, and electric current flows from the source of the write control element 130b to the spin-orbit torque wiring line 20b. At this time, the other control elements are in the OFF state. As a result, it is possible to perform magnetization reversal (writing) in the second ferromagnetic metal layer 2 of the magnetoresistance effect element 10b.

In this case, when the current value from the source of the write control element 130b is 1 mA, a current of approximately 0.976 mA flows in the magnetoresistance effect element 10. The leak current flowing in the magnetoresistance effect element 10d that is adjacent in the longitudinal direction is merely about 0.8 pA. Additionally, since the element selection control element 120a and the write control element 130a are controlled to be in the OFF state, the leak current flowing in the magnetoresistance effect element 10a that is adjacent in the lateral direction is merely about 1.7 pA. In other words, in the magnetic memory 200A of the present embodiment, there is only slight current leakage during writing.

(Integration Density)

Next, We will be explained about the integration density.

In the magnetic memory 200A illustrated in FIG. 7, for example, the read control element 110a spans across multiple spin-orbit torque type magnetoresistance effect elements 100 (100a, 100c), and can be provided as a unit on an end portion of the integrated circuit board or the like. In other words, in the magnetic memory 200A illustrated in FIG. 7, the read control element 110a does not have much influence on the integration properties of the spin-orbit torque type magnetoresistance effect elements 100 (100a, 100c).

For this reason, a single unit cell that affects the integration properties of the integrated circuit can be considered to be formed by a single spin-orbit torque type magnetoresistance effect element 100 and two control elements. The two control elements are the element selection control element 120 and the write control element 130 in the magnetic memory 200A.

In the present embodiment, depending on the arrangement, as mentioned above, it is possible to reduce the number of control elements affecting the integration properties to two.

Next, a configuration example and an arrangement example when forming the magnetic memory 200A as an integrated circuit will be explained.

Figure 8:
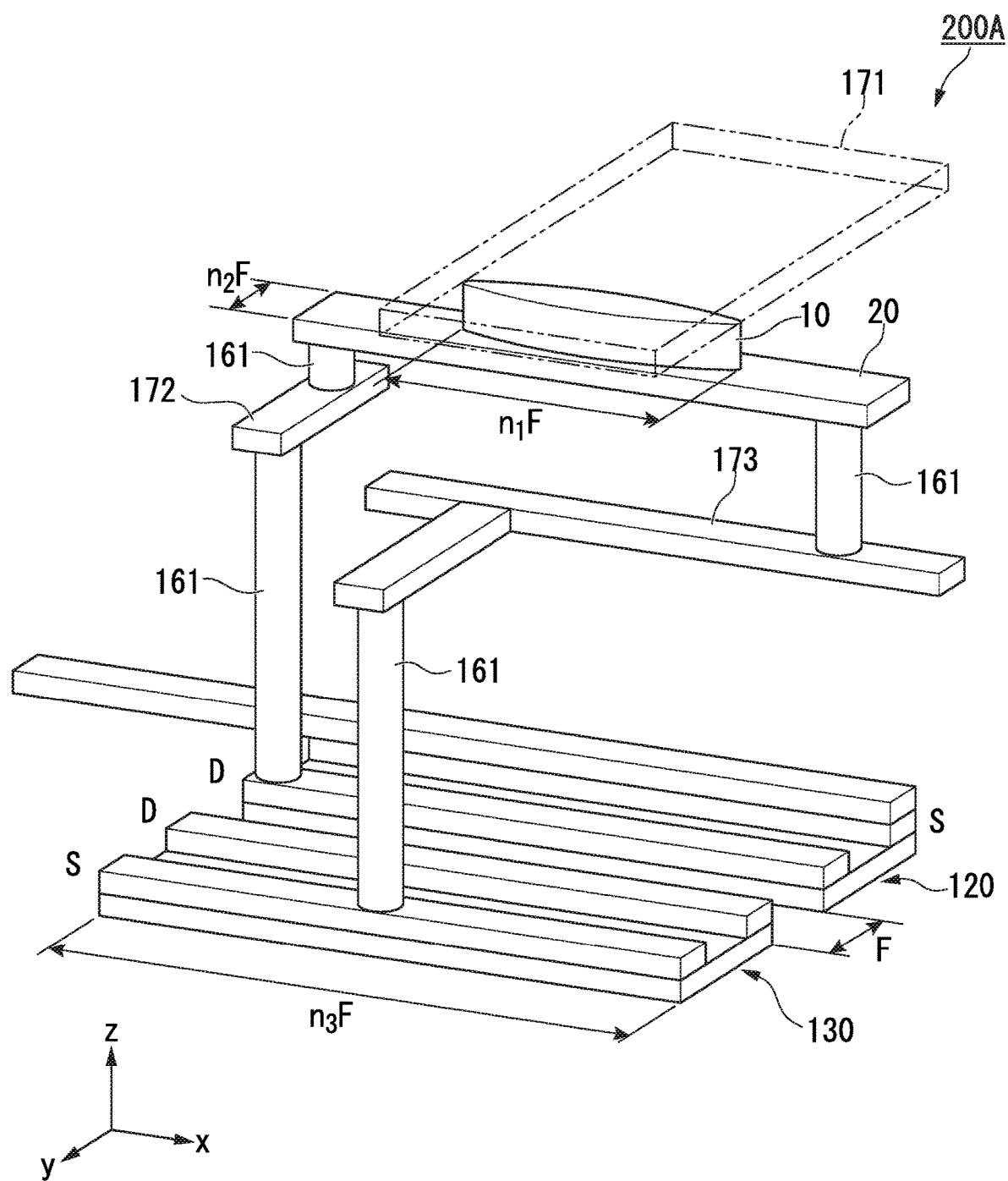
FIG. 8 is a perspective view of a spin-orbit torque type magnetoresistance effect element, an element selection control element, a read control element and spin-orbit torque wiring according to the second embodiment, when arranged three-dimensionally.

FIG. 8 is a perspective view of a spin-orbit torque type magnetoresistance effect element 100, an element selection control element 120, a write control element 130 and spin-orbit torque wiring 20 according to the second embodiment, when arranged three-dimensionally. The coordinate system is the same as that in FIG. 2. In FIG. 8, reference numbers 171 to 174 respectively denote wiring provided in each layer. Additionally, reference number 161 denotes a through-via that connects wiring to wiring.

The arrangement example illustrated in FIG. 8 is merely one example, and the invention is not limited thereto.

As illustrated in FIG. 8, a magnetoresistance effect element 10 is joined to the spin-orbit torque wiring 20.

In the magnetoresistance effect element 10, a first ferromagnetic metal layer 1 is connected to wiring 171. Additionally, the wiring 171 is connected to a plurality of adjacent magnetoresistance effect elements 10, as illustrated in FIG. 7. A read control element 110 (FIG. 7) is connected to the wiring 171.

As for the spin-orbit torque wiring 20, one end is connected to the element selection control element 120 via the wiring 172 and a through via 161 (FIG. 7), and the other end is connected to the write control element 130 via the wiring 173 and a through-via 161 (FIG. 7).

As illustrated in FIG. 8, the integrated magnetic memory 200A has an element selection control element 120 and a write control element 130 arranged below a magnetoresistance effect element 10 in the z-direction. The integrated magnetic memory 200A has a write control element 130 that is shared between bits.

As illustrated in FIG. 8, the magnetic memory 200A has an element selection control element 120 and a write control element 130 that are proximately arranged in a third direction (y-direction) intersecting with the first direction (z-direction) and the second direction (x-direction).

In the magnetic memory 200A, a maximum electric current flowing in the element selection control elements 120 and the write control elements 130 can be made larger than a maximum electric current flowing in the read control elements 110.

In FIG. 8, the length of the read control element 110 in the x-direction is shown as being the same length as that of the element selection control element 120, but it is sufficient for the length of the read control element 110 in the x-direction to be sum of the lengths, in the x-direction, of the wiring 156, insulating space, and the wiring 153. For example, if the minimum processing size for the length in the circuit configuration is defined as being F, then the minimum length of the read control element 110 in the x-direction is 3 F. Additionally, the minimum length of the read control element 110 in the y-direction is 3 F. As a result thereof, the read control element 110 can be made smaller than the other control elements.

As illustrated in FIG. 8, a space is needed between adjacent elements that are present on the same plane in order to avoid short circuits between the elements. This space must have a gap of at least the minimum processing size F. Thus, a width of at least 8 F is necessary in the y-direction for a unit cell in the integrated circuit.

An integrated circuit of the magnetic memory 200A of the second embodiment can be configured in the same manner as that explained using FIG. 4 and FIG. 5 in the first embodiment.

For this reason, in the magnetic memory 200A also, the magnetoresistance effect elements 10 may be arranged at equidistant intervals in the second direction (x-direction) and/or the third direction (y-direction). As a result, according to the present embodiment, it is possible to achieve high-density integration.

Additionally, in the magnetic memory 200A also, the regions necessary to store one bit of information may be proximately arranged at equidistant intervals in the second direction (x-direction). As a result, according to the present embodiment, the integration density can be increased.

Additionally, in the magnetic memory 200A, the regions necessary to store one bit of information may be proximately arranged at equidistant intervals in the third direction (y-direction). As a result, according to the present embodiment, the integration density can be increased.

As described above, the magnetic memory 200A of the present embodiment comprises a plurality of magnetoresistance effect elements 10 that hold information (data), each comprising a first ferromagnetic metal layer 1 with a fixed magnetization direction, a second ferromagnetic metal layer 2 with a varying magnetization direction, and a non-magnetic layer 3 sandwiched between the first ferromagnetic metal layer 1 and the second ferromagnetic metal layer 2; a first control element (read control element 110) that controls reading of the information, connected to each of the plurality of first ferromagnetic metal layers 1; a plurality of spin-orbit torque wiring lines 20 that extend in a second direction (x-direction) intersecting with a first direction (z-direction) which is a stacking direction of the magnetoresistance effect elements 10, wherein each of the second ferromagnetic metal layers 2 is joined to one spin-orbit torque wiring line 20; a plurality of second control elements (element selection control elements 120) that control electric current flowing through the spin-orbit torque wiring lines 20, wherein a first connection point (the other end of the resistance 22) in each of the spin-orbit torque wiring lines 20 is connected to one second control element; and a plurality of third control elements (write control elements 130) that control writing of the information, wherein a second connection point (the other end of the resistance 21) in each of the spin-orbit torque wiring lines 20 is connected to one third control element.

Due to this configuration, the magnetic memory 200A of the present embodiment is able to lower the reversal current (leak current) as mentioned above. As a result, according to the present embodiment, the integration density can be increased.

Additionally, in the magnetic memory 200A of the present embodiment, electric current will not tend to flow from the spin-orbit torque wiring layer to the magnetoresistance effect elements, and the spin amount that is supplied from the spin-orbit torque wiring layer is large, so that magnetization reversal is possible even with a small current.

Additionally, in the magnetic memory 200A of the present embodiment, the magnetic resistance during reading can be made large, and reading errors can be reduced.

Additionally, in the magnetic memory 200A of the present embodiment, the number of control elements affecting the integration can be held to just two. As a result thereof, according to the present embodiment, the integration density can be increased. Additionally, in the magnetic memory 200A of the present embodiment, the read control elements 110 can be made smaller than the other control elements. As a result, according to the present embodiment, the integration density can be increased.

Third Embodiment

An example in which a magnetic memory according to an embodiment is applied to a magnetic-field-assisted SOT-MRAM will be explained.

Figure 9:
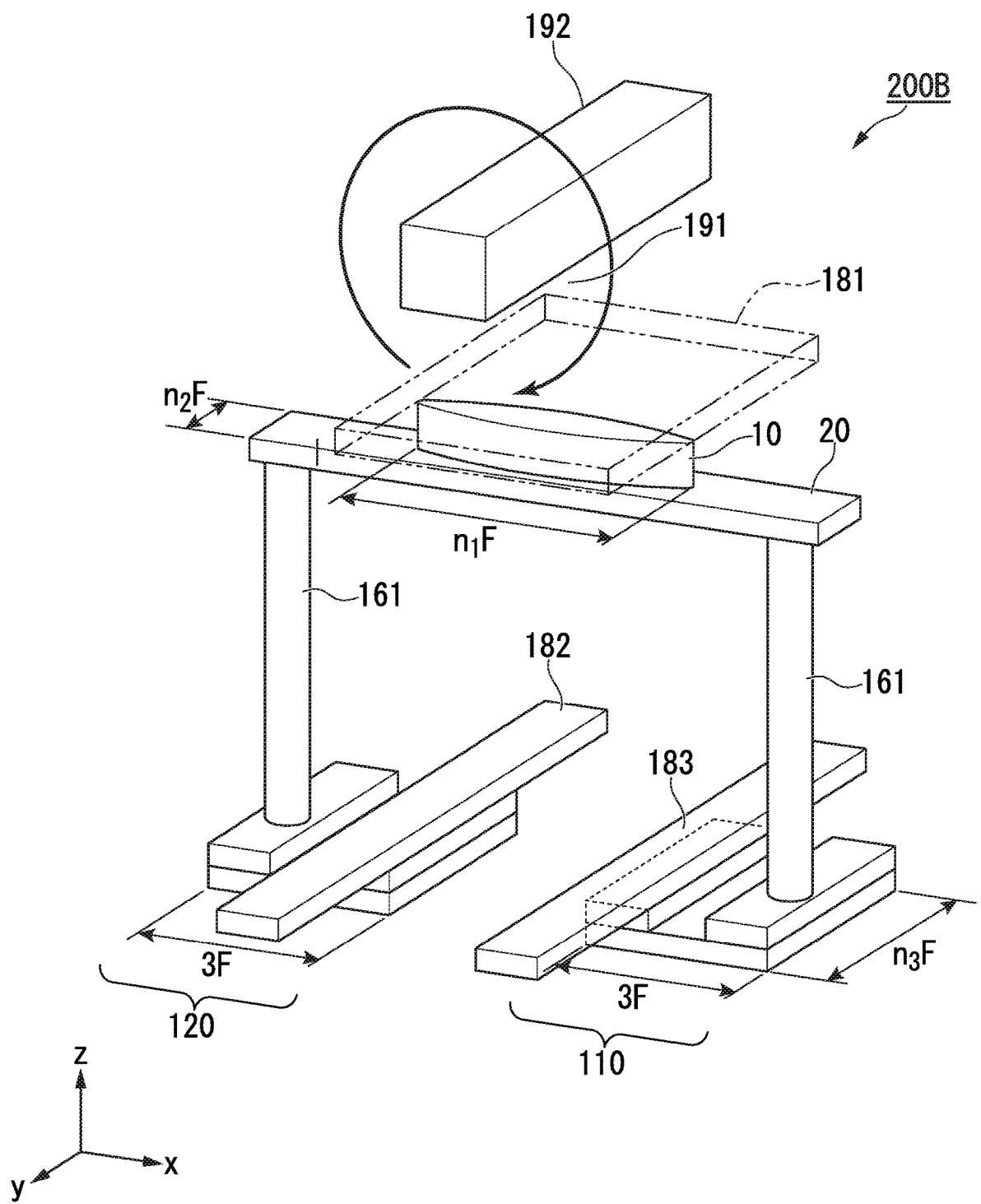
FIG. 9 is a perspective view of a modification example of a spin-orbit torque type magnetoresistance effect element, an element selection control element, a write control element, spin-orbit torque wiring and magnetic-field-providing wiring according to a third embodiment, when arranged three-dimensionally.

FIG. 9 is a perspective view of a modification example of a spin-orbit torque type magnetoresistance effect element 100, a write control element 130, an element selection control element 120, spin-orbit torque wiring 20 and magnetic-field-providing wiring 192 according to the third embodiment, when arranged three-dimensionally. In the present embodiment, the channels in the write control element 130 and the element selection control element 120 are oriented in the x-direction. The coordinate system is the same as that in FIG. 2. In FIG. 9, reference numbers 181 to 183 respectively denote wiring provided in each layer. Reference number 161 denotes a through-via that connects wiring to wiring. Reference number 191 denotes an insulating layer. Reference number 192 denotes magnetic-field-providing wiring for applying a magnetic field in a direction perpendicular to the magnetization direction of the magnetoresistance effect element 10.

The arrangement example illustrated in FIG. 9 is merely one example, and the invention is not limited thereto.

As illustrated in FIG. 9, a magnetoresistance effect element 10 is joined to the spin-orbit torque wiring 20.

In the magnetoresistance effect element 10, the first ferromagnetic metal layer 1 is connected to wiring 181. An insulating layer 191 is formed between the wiring 181 and the magnetic-field-providing wiring 192. Additionally, a read control element 110 is connected to the wiring 181. When electricity is passed through the wiring 181, the write control element 130 and the element selection control element 120 are turned to the ON state, thereby performing a writing operation.

As for the spin-orbit torque wiring 20, one end is connected to the element selection control element 120 via a through-via 161, and the other end is connected to the write control element 130 via a through-via 161. Wiring 182 is connected to the element selection control element 120. Wiring 183 is connected to the write control element 130.

In the example illustrated in FIG. 9, the wiring 181 to which the read control element 110 is connected is arranged above the magnetoresistance effect element 10 in the z-direction, and the write control element 130 and the element selection control element 120 are arranged below the magnetoresistance effect element 10 in the z-direction, but the invention is not limited thereto. It is possible to arrange the wiring 183 to which the write control element 130 is connected to be above the magnetoresistance effect element 10 in the z-direction, and to arrange the element selection control element 120 and the write control element 110 to be below the magnetoresistance effect element 10 in the z-direction.

According to the configuration in FIG. 9, the magnetoresistance effect element 10 can be connected to the control elements more simply than in the configuration in FIG. 2 etc., so the magnetic memory 200B can be made at a lower cost.

The integrated magnetic memory 200B illustrated in FIG. 9, like the magnetic memory 200A illustrated in FIG. 8, has the element selection control element 120 and the write control element 130 arranged below the magnetoresistance effect element 10 in the z-direction. The integrated magnetic memory 200B has read control elements 110 that are shared between bits.

The configuration illustrated in FIG. 9 is one example, and may be arranged in a manner analogous to FIG. 2 or FIG. 8. As a result thereof, the present embodiment can also obtain effects similar to those of the first embodiment and the second embodiment.

While the control elements were arranged in parallel in the y-direction in the first embodiment or the second embodiment, the control elements T may be arranged in parallel in the x-direction in a manner analogous to FIG. 9.

The cell size necessary for arranging the magnetic memory 200B will be explained by using FIG. 10 with reference to FIG. 9.

Figure 10:
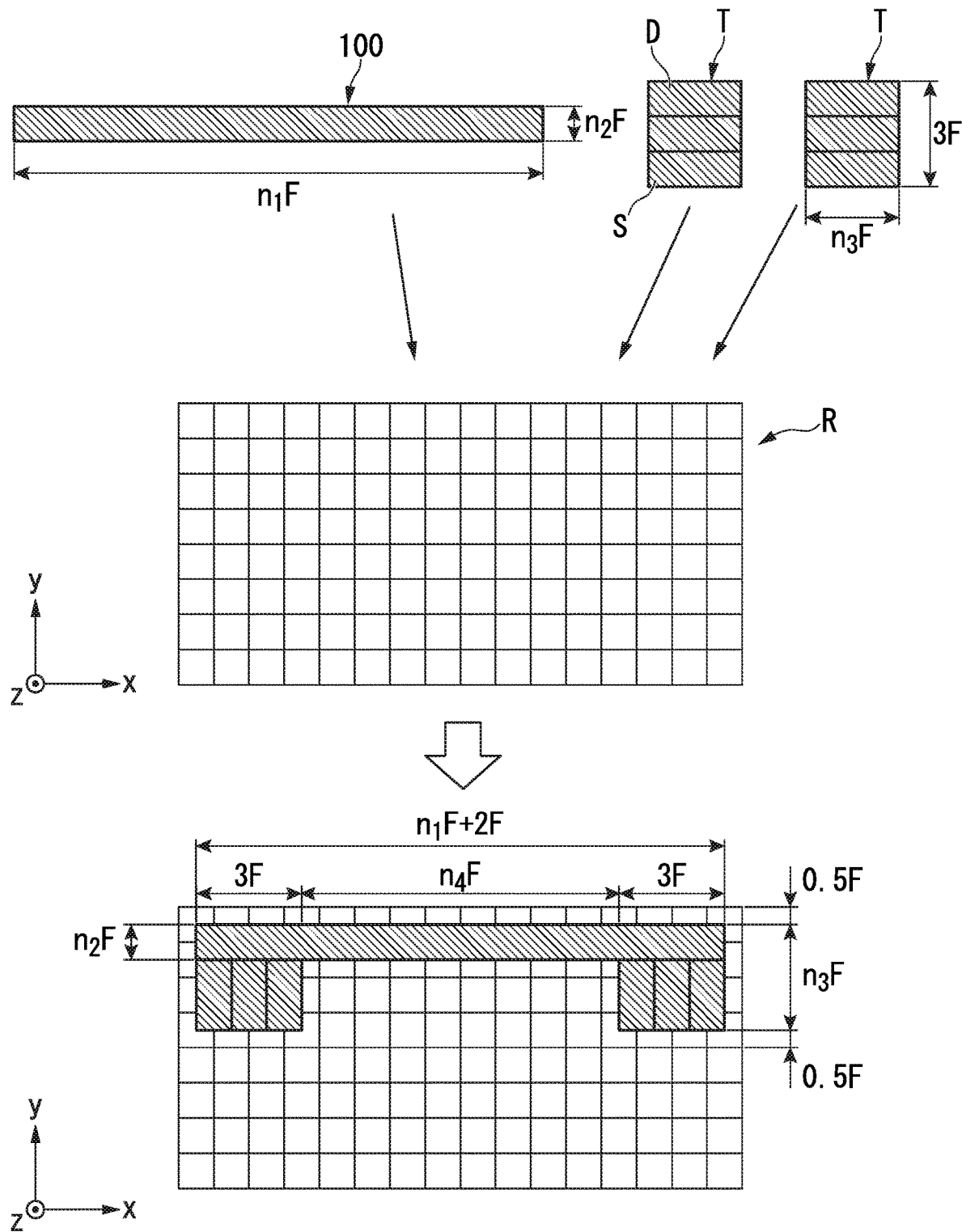
FIG. 10 is a diagram for explaining the cell size necessary for arranging one spin-orbit torque type magnetoresistance effect element and two control elements as illustrated in FIG. 9.

As illustrated in FIG. 10, the sizes of the elements are not different. However, by changing the arrangement, the width in the x-direction that is necessary for providing two control elements changes. The width in the x-direction that is necessary for two control elements is twice the width (3 F) of each element in the x-direction, plus the distance ($n_4$F) between the elements. Since the minimum distance between the elements is F, the width in the x-direction that is necessary for the two control elements must be, at minimum, 7 F. Additionally, 1 F is necessary in order to ensure separation between adjacent unit cells, so at least 8 F is necessary.

This size 8 F is obtained by the size (3×3) of two control elements, the spacing (1) between control elements and the space (1) with respect to an adjacent cell. Thus, the minimum length of the spin-orbit torque wiring is 7 F. In order to supply in-plane electric current to the spin-orbit torque wiring, a space of 2 F is necessary for through-vias 161 (1) that are contacted from below, and a magnetoresistance effect element must be provided on the inside thereof. Thus, the size of a magnetoresistance effect element that is tolerable on 7 F of spin-orbit torque wiring is 5 F. Conversely, even if the size of the magnetoresistance effect element is 5 F or less, the spin-orbit torque wiring must be 7 F long. If the size of the magnetoresistance effect element is 5 F or more, then the length of the spin-orbit torque wiring must be the size of the magnetoresistance effect element plus 3 F (1+2).

Since the length in the y-direction is that of the control element (1) and the space (1) between cells, the length in the y-direction can be obtained by adding 1 F to the size estimated from the necessary electric current. As a result thereof, the length in the x-direction must be a minimum of 8 F.

The cell areas that are necessary for different shapes of the magnetoresistance effect element, when the minimum processing size F is assumed to be 7 nm, are shown in Table 7. The cell areas that are necessary for different shapes of the magnetoresistance effect element, when the minimum processing size F is assumed to be 10 nm, are shown in Table 8. The cell areas that are necessary for different shapes of the magnetoresistance effect element, when the minimum processing size F is assumed to be 28 nm, are shown in Table 9. As shown in Tables 7 to 9, the integration density is higher for combinations in which the direction of the channels in the control elements are orthogonal to the long axis of an MTJ. Additionally, the examples in Tables 7 to 9 were calculated under conditions in which information (data) can be continuously retained for 10 years.

TABLE 7

| | Spin-Orbit Torque Type Magnetoresistance Effect Element | | | | | | | | | |
|---|---|---|---|---|---|---|---|---|---|---|
| | Magnetoresistance Effect Element | | | | Spin-Orbit Torque Wiring | | | | Control Element | |
| | Width L2 in y-direction (nm) | By Minimum Processing Size ($n_2$F) | Width L1 in x-direction (nm) | By Minimum Processing Size ($n_1$F) | Width (nm) | Thickness (nm) | Cross-sectional Area (nm$^2$) | Reversal Current (μA) | FET Width (nm) | By Minimum Processing Size ($n_3$F) | Integrated Circuit Cell Area (F$^2$) |
| Example 40 | 7 | 1F | 900 | 129F | 7 | 10 | 70 | 4.3 | 8.68 | 2F | 396 |
| Example 41 | 14 | 2F | 450 | 65F | 14 | 10 | 140 | 8.7 | 17.36 | 3F | 272 |
| Example 42 | 21 | 3F | 300 | 43F | 21 | 10 | 210 | 13.0 | 26.04 | 4F | 230 |
| Example 43 | 28 | 4F | 225 | 33F | 28 | 10 | 280 | 17.4 | 34.72 | 5F | 216 |
| Example 44 | 35 | 5F | 180 | 26F | 35 | 10 | 350 | 21.7 | 43.4 | 7F | 232 |
| Example 45 | 42 | 6F | 150 | 22F | 42 | 10 | 420 | 26.0 | 52.08 | 8F | 225 |
| Example 46 | 49 | 7F | 129 | 19F | 49 | 10 | 490 | 30.4 | 60.76 | 9F | 220 |
| Example 47 | 56 | 8F | 113 | 17F | 56 | 10 | 560 | 34.7 | 69.44 | 10F | 220 |
| Example 48 | 63 | 9F | 100 | 15F | 63 | 10 | 630 | 39.1 | 78.12 | 12F | 234 |
| Example 49 | 70 | 10F | 90 | 13F | 70 | 10 | 700 | 43.4 | 86.8 | 13F | 224 |
| Example 50 | 77 | 11F | 82 | 12F | 77 | 10 | 770 | 47.7 | 95.48 | 14F | 225 |

TABLE 8

| | Spin-Orbit Torque Type Magnetoresistance Effect Element | | | | | | | | | |
|---|---|---|---|---|---|---|---|---|---|---|
| | Magnetoresistance Effect Element | | | | Spin-Orbit Torque Wiring | | | | Control Element | |
| | Width L2 in y-direction (nm) | By Minimum Processing Size ($n_2$F) | Width L1 in x-direction (nm) | By Minimum Processing Size ($n_1$F) | Width (nm) | Thickness (nm) | Cross-sectional Area (nm$^2$) | Reversal Current (μA) | FET Width (nm) | By Minimum Processing Size ($n_3$F) | Integrated Circuit Cell Area (F$^2$) |
| Example 51 | 10 | 1F | 630 | 63F | 10 | 10 | 100 | 6.2 | 12.4 | 2F | 198 |
| Example 52 | 20 | 2F | 315 | 32F | 20 | 10 | 200 | 12.4 | 24.8 | 3F | 140 |
| Example 53 | 30 | 3F | 210 | 21F | 30 | 10 | 300 | 18.6 | 37.2 | 4F | 120 |
| Example 54 | 40 | 4F | 158 | 16F | 40 | 10 | 400 | 24.8 | 49.6 | 5F | 114 |
| Example 55 | 50 | 5F | 126 | 13F | 50 | 10 | 500 | 31 | 62 | 7F | 128 |
| Example 56 | 60 | 6F | 105 | 11F | 60 | 10 | 600 | 37.2 | 74.4 | 8F | 126 |
| Example 57 | 70 | 7F | 90 | 9F | 70 | 10 | 700 | 43.4 | 86.8 | 9F | 120 |

TABLE 9

| | Spin-Orbit Torque Type Magnetoresistance Effect Element | | | | | | | | | | |
|---|---|---|---|---|---|---|---|---|---|---|---|
| | Magnetoresistance Effect Element | | | | Spin-Orbit Torque Wiring | | | | Control Element | | |
| | Width L2 in y-direction (nm) | By Minimum Processing Size ($n_2F$) | Width L1 in x-direction (nm) | By Minimum Processing Size ($n_1F$) | Width (nm) | Thickness (nm) | Cross-sectional Area ($nm^2$) | Reversal Current (µA) | FET Width (nm) | By Minimum Processing Size ($n_3F$) | Integrated Circuit Cell Area ($F^2$) |
| Example 58 | 28 | 1F | 225 | 9F | 28 | 10 | 280 | 17.4 | 34.7 | 2F | 36 |
| Example 59 | 56 | 2F | 113 | 4F | 56 | 10 | 560 | 34.7 | 69.4 | 3F | 32 |
| Comparative Example 11 | 84 | 3F | 75 | 3F | 84 | 10 | 840 | 52 | 104.16 | 4F | 40 |
| Comparative Example 12 | 112 | 4F | 56 | 3F | 112 | 10 | 1120 | 69 | 138.88 | 5F | 48 |
| Comparative Example 13 | 140 | 5F | 45 | 2F | 140 | 10 | 1140 | 87 | 173.6 | 7F | 64 |
| Comparative Example 14 | 168 | 6F | 38 | 2F | 168 | 10 | 1680 | 104 | 208.32 | 8F | 72 |
| Comparative Example 15 | 196 | 7F | 33 | 2F | 196 | 10 | 1960 | 122 | 243.04 | 9F | 80 |

As indicated above, the magnetic memory 200B of the present embodiment is provided with an insulating layer 181 that contacts the magnetoresistance effect element 10, and magnetic-field-providing wiring 182 for applying a magnetic field in a direction perpendicular to the magnetization direction of the magnetoresistance effect elements across the insulating layer.

Therefore, according to the present embodiment, it is possible to partially apply the magnetic memory 200 of the first embodiment or the magnetic memory 200A of the second embodiment to a magnetic-field-assisted SOT-MRAM.

As a result thereof, according to the present embodiment, the reversal current can be lowered as in the first embodiment and the second embodiment, and the integration density can be increased.

<Explanation of Spin-Orbit Torque Type Magnetoresistance Effect Element 100, Magnetoresistance Effect Element 10>

The spin-orbit torque type magnetoresistance effect element 100 will be explained.

Figure 11:
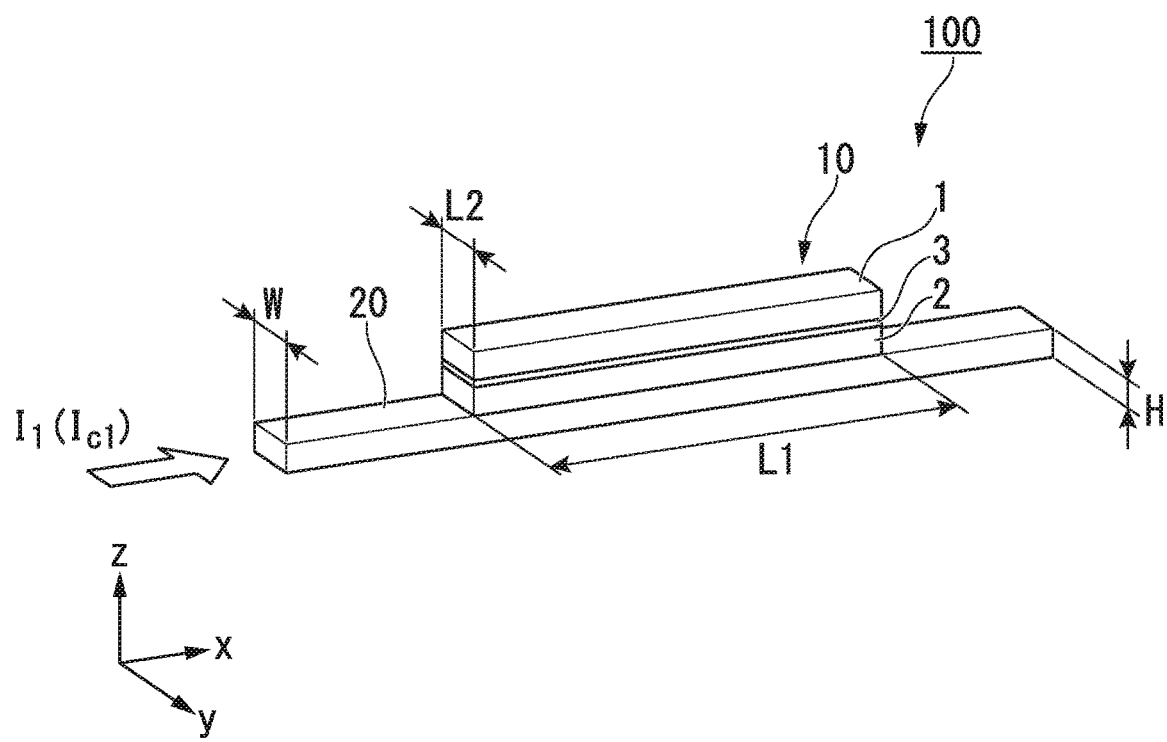
FIG. 11 is a perspective view schematically illustrating a spin-orbit torque type magnetoresistance effect element.

FIG. 11 is a perspective view schematically illustrating a spin-orbit torque type magnetoresistance effect element 100.

The spin-orbit torque type magnetoresistance effect element 100 has a magnetoresistance effect element 10 and spin-orbit torque wiring 20 as illustrated in FIG. 11. The coordinate (directions) in FIG. 11 are the same as in FIG. 2.

Next, we explain the magnetoresistance effect element 10. The magnetoresistance effect element 10 has a first ferromagnetic metal layer 1 having a fixed magnetization direction, a second ferromagnetic metal layer 2 having a variable magnetization direction, and a non-magnetic layer 3 sandwiched between the first ferromagnetic metal layer 1 and the second ferromagnetic metal layer 2.

The magnetoresistance effect element 10 functions by having the orientation of the magnetization M1 of the first ferromagnetic metal layer 1 fixed in a single direction, whereas the orientation of the magnetization M2 of the second ferromagnetic metal layer 2 is able to vary relatively. When applied to coercive force difference (pseudo spin valve) MRAM (Magnetoresistive Random Access Memory), the coercive force of the first ferromagnetic metal layer is larger than the coercive force of the second ferromagnetic metal layer, and when applied to exchange bias (spin valve) MRAM, the magnetization direction of the first ferromagnetic metal layer is fixed by exchange coupling with an antiferromagnetic layer.

When the non-magnetic layer 3 is formed from an insulator, the magnetoresistance effect element 10 is a tunneling magnetoresistance (TMR) element, whereas when the non-magnetic layer 3 is formed from a metal, the magnetoresistance effect element 10 is a giant magnetoresistance (GMR) element.

The stacking structure of the magnetoresistance effect element can employ a conventional magnetoresistance effect element stacking structure. For example, each layer may be composed of a plurality of layers, and the structure may also include other layers such as an antiferromagnetic layer for fixing the magnetization direction of the first ferromagnetic metal layer 1. The first ferromagnetic metal layer 1 is also called the fixed layer or reference layer, whereas the second ferromagnetic metal layer 2 is also called the free layer or the memory layer.

Conventional materials can be used as the material for the first ferromagnetic metal layer 1. For example, metals selected from the group consisting of Cr, Mn, Co, Fe and Ni, and alloys containing at least one of these metals and having ferromagnetism can be used. Further, alloys containing at least one of these metals and at least one element among B, C and N can also be used. Specific examples include Co—Fe and Co—Fe—B.

Further, in order to achieve higher output, a Heusler alloy such as $Co_2FeSi$ is preferably used. Heusler alloys contain intermetallic compounds having a chemical composition of $X_2YZ$, wherein X is a noble metal element or a transition metal element belonging to the Co, Fe, Ni or Cu group of the periodic table, whereas Y is a transition metal belonging to the Mn, V, Cr or Ti group of the periodic table, and can select the elemental species of X, and Z is a typical element of group III to group V. Specific examples include $Co_2FeSi$, $Co_2MnSi$, and $Co_2 Mn_{1-a}Fe_aAl_bSi_{1-b}$.

Furthermore, in order to increase the coercive force of the first ferromagnetic metal layer 1 on the second ferromagnetic metal layer 2, an antiferromagnetic material such as IrMn or PtMn may be used as the material that contacts the first ferromagnetic metal layer 1. Moreover, in order to ensure that the leakage magnetic field of the first ferromagnetic metal layer 1 does not affect the second ferromagnetic metal layer 2, a structure having synthetic ferromagnetic coupling may be used.

Furthermore, in those cases where the orientation of the magnetization of the first ferromagnetic metal layer 1 is perpendicular to the stacking surface, a stacked film of Co and Pt is preferably used. Specifically, the structure of the first ferromagnetic metal layer 1 may be [FeB (1.0 nm)/Ta (0.2 nm)/[Pt (0.16 nm)/Co (0.16 nm)]$_4$/Ru (0.9 nm)/Co (0.24 nm)/Pt (0.16 nm)]$_6$ in order from the non-magnetic layer 3.

For the material of the second ferromagnetic metal layer 2, a ferromagnetic material, and particularly a soft magnetic material, can be used. Examples of materials that can be used include metals selected from the group consisting of Cr, Mn, Co, Fe and Ni, alloys containing at least one of these metals, and alloys containing at least one of these metals and at least one element among B, C and N. Specific examples include Co—Fe, Co—Fe—B and Ni—Fe.

The orientation of the magnetization of the second ferromagnetic metal layer 2 is z-direction (perpendicular to the stacking surface). In those cases where the orientation of the magnetization of the second ferromagnetic metal layer 2 is z-direction, the size of the magnetoresistance effect element 10 becomes small. The orientation of the magnetization of the second ferromagnetic metal layer 2 is influenced by the crystal structure constituting the second ferromagnetic metal layer 2 and the thickness of the second ferromagnetic metal layer 2. The thickness of the second ferromagnetic metal layer 2 is preferably not more than 2.5 nm. Because the perpendicular magnetic anisotropy effect is attenuated as the thickness of the second ferromagnetic metal layer 2 is increased, the thickness of the second ferromagnetic metal layer 2 is preferably kept thin.

Conventional materials can be used as the non-magnetic layer 3.

For example, when the non-magnetic layer 3 is formed from an insulator (and forms a tunnel barrier layer), examples of materials that can be used include $Al_2O_3$, $SiO_2$, MgO and $MgAl_2O_4$. In addition to these materials, materials in which a portion of the Al, Si or Mg has been substituted with Zn or Be or the like can also be used. Among the above materials, MgO and $MgAl_2O_4$ are materials that enable the realization of coherent tunneling, and therefore enable efficient injection of spin.

Further, when the non-magnetic layer 3 is formed from a metal, examples of materials that can be used include Cu, Au, and Ag and the like.

The magnetoresistance effect element 10 may also have other layers. For example, the magnetoresistance effect element 10 may have a base layer on the opposite surface of the second ferromagnetic metal layer 2 from the non-magnetic layer 3, and/or may have a capping layer on the opposite surface of the first ferromagnetic metal layer 1 from the non-magnetic layer 3.

A layer disposed between the spin-orbit torque wiring 20 and the magnetoresistance effect element 10 preferably does not dissipate the spin propagated from the spin-orbit torque wiring 20. For example, silver, copper, magnesium, and aluminum and the like have a long spin diffusion length of at least 100 nm, and are known to be resistant to spin dissipation.

The thickness of this layer is preferably not more than the spin diffusion length of the material used for forming the layer. Provided the thickness of the layer is not more than the spin diffusion length, the spin propagated from the spin-orbit torque wiring 20 can be transmitted satisfactorily to the magnetoresistance effect element 10.

Next, we explain the spin-orbit torque wiring 20.

The spin-orbit torque wiring 20 extends along the x-direction. The spin-orbit torque wiring 20 is adjoined to one surface of the second ferromagnetic metal layer 2 in the z-direction. The spin-orbit torque wiring 20 may be connected directly to the second ferromagnetic metal layer 2, or connected via another layer.

The spin-orbit torque wiring 20 is formed from a material that generates a pure spin current by the spin Hall effect when a current flows through the material. This material may have any composition capable of generating a pure spin current in the spin-orbit torque wiring 20. Accordingly, the material is not limited to materials formed from simple elements, and may also be composed of a portion formed from a material that generates a pure spin current and a portion formed from a material that does not generate a pure spin current.

The spin Hall effect is a phenomenon wherein when an electric current is passed through a material, a pure spin current is induced in a direction orthogonal to the orientation of the electric current as a result of spin-orbit interactions.

Figure 12:
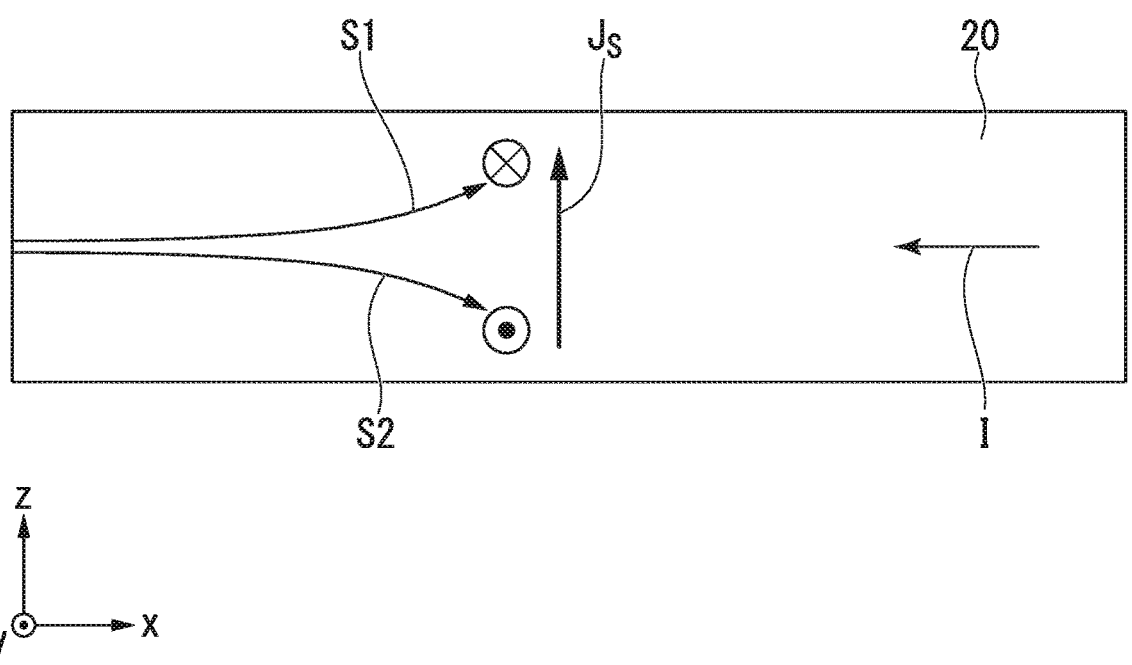
FIG. 12 is a schematic view for explaining the spin Hall effect.

A mechanism by which a pure spin current is generated by the spin Hall effect is described with reference to FIG. 12. FIG. 12 is a schematic diagram for explaining the spin Hall effect. FIG. 12 is a cross-sectional view of the spin orbit torque wiring 20 shown in FIG. 11 cut along the x-direction.

As illustrated in FIG. 12, when an electric current I flows along the direction which the spin-orbit torque wiring 20 extends, a first spin S1 oriented toward the back of the paper surface and a second spin S2 oriented toward the front of the paper surface are bent in directions orthogonal to the current. The normal Hall effect and the spin Hall effect have in common the fact that the direction of travel (movement) of the traveling (moving) electric charge (electrons) is bent, but differ significantly in terms of the fact that in the common Hall effect, charged particles moving through a magnetic field are affected by Lorentz forces, resulting in bending of the travel direction, whereas in the spin Hall effect, despite no magnetic field existing, the travel direction of the spin bends simply under the effect of the movement of the electrons (flow of current).

In a non-magnetic material (a material that is not ferromagnetic), the electron count of the first spin S1 and the electron count of the second spin S2 are equal, and therefore in FIG. 12, the electron count of the first spin S1 moved to the upward direction and the electron count of the second spin S2 moved to the downward direction are equal. Accordingly, the electric current represented by the net flux of the electric charge is zero. This type of spin current that is accompanied by no electric current is called a pure spin current.

When a current is passed through a ferromagnetic material, the fact that the first spin S1 and the second spin S2 are bent in opposite directions is the same. However, the difference in a ferromagnetic material is that one of either the first spin S1 or the second spin S2 is greater, resulting in the occurrence of a net flux for the electric charge (and the generation of a voltage). Accordingly, a material formed solely from a ferromagnetic substance cannot be used as the material for the spin-orbit torque wiring 20.

If the electron flow of the first spin S1 is represented by $J_\uparrow$, the electron flow of the second spin S2 is represented by $J_\downarrow$, and the spin current is represented by $J_S$, then the spin current is defined as $J_S = J_\uparrow - J_\downarrow$. In FIG. 12, the pure spin current $J_S$ flows in the upward direction in the figure. Here, $J_S$ is an electron flow having 100% polarizability.

We continue to explain the spin-orbit torque wiring 20 with reference to FIG. 11. In FIG. 11, when a ferromagnetic material is brought into contact with the upper surface of the spin-orbit torque wiring 20, the pure spin current diffuses and flows into the ferromagnetic material. In other words, spin is injected into the magnetoresistance effect element 10.

The spin-orbit torque wiring 20 may contain a non-magnetic heavy metal. Here, the term "heavy metal" is used to mean a metal having a specific gravity at least as large as that of yttrium. The spin-orbit torque wiring 20 may also be formed solely from a non-magnetic metal.

In such a case, the non-magnetic metal is preferably a non-magnetic metal with a large atomic number, and specifically a non-magnetic metal with an atomic number of 39 or greater having d-electrons or f-electrons in the outermost shell. The reason for this preference is that such non-magnetic metals exhibit large spin-orbit interactions that generate a spin Hall effect. The spin-orbit torque wiring 20 may also be formed solely from a non-magnetic metal with a large atomic number, having an atomic number of 39 or greater and having d-electrons or f-electrons in the outermost shell.

Typically, when a current is passed through a metal, all of the electrons move in the opposite direction of the current regardless of spin orientation, but in the case of a non-magnetic metal with a large atomic number having d-electrons or f-electrons in the outermost shell, because the spin-orbit interactions are large, the spin Hall effect greatly acts and the direction of electron movement is dependent on the electron spin orientation, meaning a pure spin current $J_S$ develops more readily.

Furthermore, the spin-orbit torque wiring 20 may contain a magnetic metal. The term "magnetic metal" means a ferromagnetic metal or an antiferromagnetic metal. By including a trace amount of a magnetic metal in the non-magnetic metal, the spin-orbit interactions can be amplified, thereby increasing the spin current generation efficiency of the electric current passed through the spin-orbit torque wiring 20. The spin-orbit torque wiring 20 may also be formed solely from an antiferromagnetic metal.

Spin-orbit interactions occur within interior fields peculiar to the substance of the spin-orbit torque wiring material. Accordingly, pure spin currents also develop in non-magnetic materials. By adding a trace amount of a magnetic metal to the spin-orbit torque wiring material, because the electron spin of the magnetic metal itself is scattered, the efficiency of spin current generation is enhanced. However, if the amount added of the magnetic metal is too large, then the generated pure spin current tends to be scattered by the added magnetic metal, resulting in a stronger action reducing the spin current. Accordingly, it is preferable that the molar ratio of the added magnetic metal is considerably lower than that of the main component of the pure spin current generation portion in the spin-orbit torque wiring. As a guide, the molar ratio of the added magnetic metal is preferably not more than 3%.

Furthermore, the spin-orbit torque wiring 20 may contain a topological insulator. The spin-orbit torque wiring 20 may also be formed solely from a topological insulator. A topological insulator is a substance in which the interior of the substance is an insulator or a high-resistance body, but the surface of the substance forms a metal-like state with spin polarization. This substances have a type of internal magnetic field known as a spin-orbit interaction. Accordingly, even if an external magnetic field does not exist, the effect of these spin-orbit interactions generates a new topological phase. This is a topological insulator, which as a result of strong spin-orbit interactions and the break of inversion symmetry at the edges, is able to generate a pure spin current with good efficiency. Examples of preferred topological insulators include SnTe, $Bi_{1.5}Sb_{0.5}Te_{1.7}Se_{1.3}$, $TlBiSe_2$, $Bi_2Te_3$, and $(Bi_{1-x}Sb_x)_2Te_3$. These topological insulators can generate spin current with good efficiency.

The configuration of the spin-orbit torque type magnetoresistance effect element 100 illustrated in FIG. 11 is merely one example, and the invention is not limited thereto. The spin-orbit torque type magnetoresistance element 100 may have constituent elements other than the magnetoresistance effect element 10 and the spin-orbit torque wiring 20. The spin-orbit torque type magnetoresistance effect element 100 may, for example, have a substrate or the like as a support. The substrate preferably has excellent flatness, and as the material, for example, Si, AlTiC or the like may be used.

(Principles of Spin-Orbit Torque Type Magnetoresistance Effect Element)

Next, the operating principles of the spin-orbit torque type magnetoresistance effect element will be explained with reference to FIG. 11.

As illustrated in FIG. 11, when a current $I_1$ is applied to the spin-orbit torque wiring 20, a pure spin current $J_S$ is generated in the z-direction. A magnetoresistance effect element 10 is provided in the z-direction of the spin-orbit torque wiring 20. Due thereto, spin is injected from the spin-orbit torque wiring 20 into the second ferromagnetic metal layer 2 of the magnetoresistance effect element 10. The injected spin applies a spin-orbit torque to the magnetization of the second ferromagnetic metal layer 2, causing magnetization reversal.

The magnetization reversal of the magnetoresistance effect element 10 depends on the amount of injected spin. The amount of spin is determined by the current density $I_{c1}$ of the electric current $I_1$ flowing through the spin-orbit torque wiring 20. The current density $I_{c1}$ of the electric current $I_1$ flowing through the spin-orbit torque wiring 20 is the value of the electric current flowing through the spin-orbit torque wiring 20 divided by the area in the plane orthogonal to the direction of flow of the electric current. For this reason, in FIG. 11, the current density $I_{c1}=I_1/WH$. In this case, W represents the length (width) of the spin-orbit torque wiring 20 in the y-direction, and H represents the thickness of the spin-orbit torque wiring 20 in the z-direction. This current density $I_{c1}$ does not include a component along the length L1 of the magnetoresistance effect element in the x-direction, and is determined by the spin-orbit torque wiring 20. For this reason, in the spin-orbit torque type magnetoresistance effect element 100, the amount of current necessary for operation can be set independently of the area (the area when viewed from the z-direction) of the magnetoresistance effect element 10.

Figure 13:
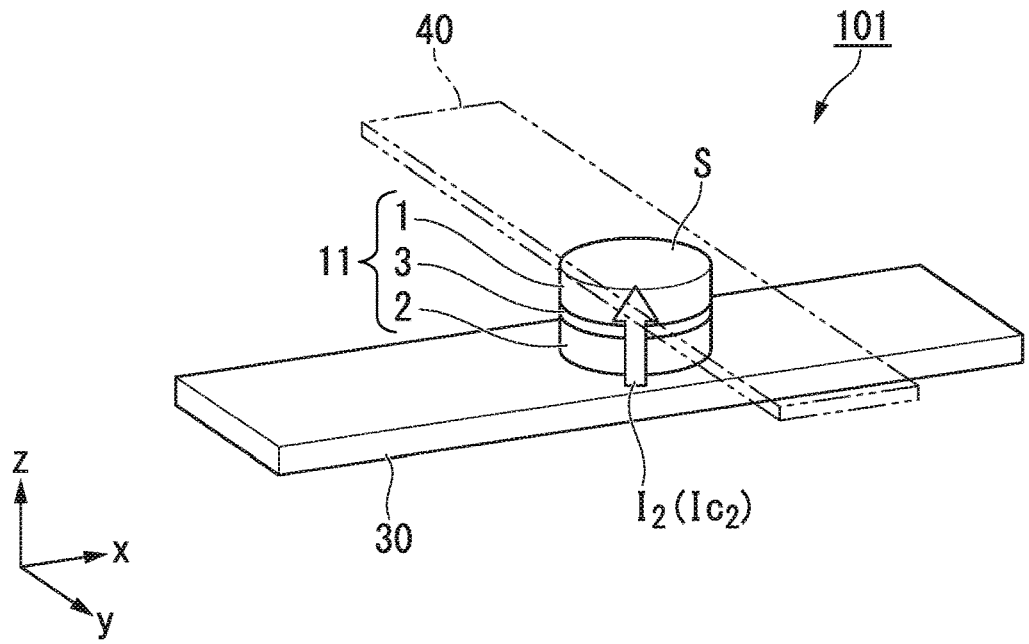
FIG. 13 is a schematic view of a spin-transfer torque type magnetoresistance effect element using STT.

FIG. 13 is a schematic view of a spin-transfer torque type magnetoresistance effect element 101 using STT. The coordinate system in FIG. 13 is the same as that in FIG. 11. The spin-transfer torque type magnetoresistance effect element 101 comprises a magnetoresistance effect element 11, first wiring 30 and second wiring 40. Any kind of conductor may be used for the first wiring 30 and the second wiring 40.

When a potential difference is provided between the first wiring 30 and the second wiring 40, an electric current $I_2$ flows in the stacking direction of the magnetoresistance effect element 11. The electric current $I_2$ generates STT, and the magnetization of the second ferromagnetic metal layer 2 is reversed.

The intensity of the STT is determined by the current density $I_{c2}$ of the electric current $I_2$ flowing in the stacking direction of the magnetoresistance effect element 11. The current density $I_{c2}$ of the electric current $I_2$ flowing in the stacking direction of the magnetoresistance effect element I1 is the value of the electric current $I_2$ flowing in the stacking direction of the magnetoresistance effect element 11 divided by the area in the plane orthogonal to the direction of flow of the electric current (the cross-sectional area S of the magnetoresistance effect element 11). For this reason, in FIG. 13, the current density $I_{c2}=I_2/S$.

This current density $I_{c2}$ has the cross-sectional area S of the magnetoresistance effect element 11 as a parameter. For this reason, the amount of current necessary for the operation of the spin-transfer torque type magnetoresistance effect element 101 depends on the area (the area when viewed from the z-direction) of the magnetoresistance effect element 11.

If the cross-sectional area S of the magnetoresistance effect element 11 is small, then there is an increased probability that the magnetization of the second ferromagnetic metal layer 2 will be reversed under the influence of thermal disturbances or the like. For this reason, the cross-sectional area S of the magnetoresistance effect element 11 must be at least a predetermined size in order to ensure the stability of magnetic recording. In other words, in order to operate the spin-transfer torque type magnetoresistance effect element 101, a current amount obtained by multiplying the "current density necessary for magnetization reversal" with the "area for which magnetization can be stably maintained" is necessary.

In contrast, in order to operate the spin-orbit torque type magnetoresistance effect element 100 according to the embodiment, a current amount obtained by multiplying the "current density necessary for magnetization reversal" with the "cross-sectional area of the spin-orbit torque wiring 20" is necessary. The "cross-sectional area of the spin-orbit torque wiring 20" can be set to any value. For this reason, in the spin-orbit torque type magnetoresistance effect element 100, the total amount of current necessary for operation can be made smaller.

As illustrated in FIG. 11, the magnetoresistance effect element 10 in the spin-orbit torque type magnetoresistance effect element 100 has shape anisotropy. The length L1 of the magnetoresistance effect element 10 in the x-direction is longer than the length (width) L2 in the y-direction. By configuring the spin-orbit torque type magnetoresistance effect element 100 in this way, the total amount of current necessary for operation can be made smaller.

Next, the reasons for being able to make the total amount of current necessary for operation smaller will be explained.

Figure 14:
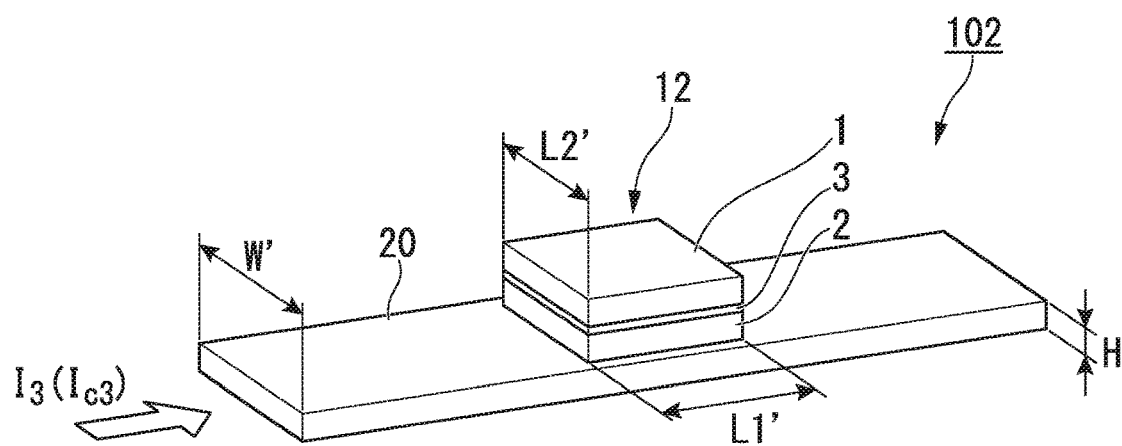
FIG. 14 is a schematic view of a spin-orbit torque type magnetoresistance effect element in a comparative example, in which the magnetoresistance effect element does not have shape anisotropy.

FIG. 14 is a schematic view of a spin-orbit torque type magnetoresistance effect element 102 according to a comparative example wherein the magnetoresistance effect element 12 does not have shape anisotropy. The coordinate system in FIG. 14 is the same as that in FIG. 11. The length L1' of the magnetoresistance effect element 12 illustrated in FIG. 14 in the x-direction is equal to the length (width) L2' in the y-direction. In other words, the magnetoresistance effect element 12 is square-shaped when viewed from the z-direction.

Generally speaking, when introducing elements of limited size into a limited space, elements having higher symmetry can be more efficiently placed. For this reason, in order to raise the level of integration of MRAM, it would be normal to increase the symmetry of the magnetoresistance effect elements. In other words, magnetoresistance effect elements that are highly symmetrical, i.e. square-shaped (see FIG. 13) or circular, when viewed from the z-direction, would be chosen for use as the integrated elements.

In order to operate the spin-orbit torque type magnetoresistance effect element 102, an electric current $I_3$ obtained by multiplying the "current density $I_{c3}$ necessary for magnetization reversal" with the "cross-sectional area (W'H) of the spin-orbit torque wiring 20" is necessary. In other words, the relation $I_3=I_{c3}\times W'H$ is established.

Since the layer configurations of the magnetoresistance effect element 10 (FIG. 11) and the magnetoresistance effect element 12 (FIG. 14) are identical, the current density $I_{c1}$ and the current density $I_{c3}$ are about the same. When considering that there is a need to make the areas of magnetoresistance effect elements the same in order to ensure thermal stability, the length L2' of the magnetoresistance effect element 12 in the y-direction must be made longer, and in conjunction therewith, the width W' of the spin-orbit torque wiring 20 in the y-direction must also be made wider. In other words, the width W' of the spin-orbit torque type magnetoresistance effect element 102 in the y-direction is wider than the width W of the spin-orbit torque type magnetoresistance effect element 100 in the y-direction. In other words, the electric current $I_1$ that is necessary to operate the spin-orbit torque type magnetoresistance effect element 100 is lower than the electric current $I_3$ that is necessary to operate the spin-orbit torque type magnetoresistance effect element 102.

In view of the above, it is preferable for the width W of the magnetoresistance effect element 10 to be as narrow as possible. For example, the smallest width that is possible by processing techniques such s photolithography is preferred. Additionally, the thickness H of the spin-orbit torque wiring 20 is preferably as thin as possible, but the thickness should preferably be at least 10 nm in order to allow a sufficient amount of current to flow.

When the cross-sectional area of the spin-orbit torque wiring 20 is small, the resistance can be expected to become greater. However, the spin-orbit torque wiring 20 is metallic and the resistance is not expected to become so large that the operation of the element will be affected. The increase in resistance is trivial in comparison to cases in which the electric current is supplied to a tunnel barrier layer, as in TMR elements in which magnetization reversal is performed by STT.

The resistance value at the portion of the spin-orbit torque wiring 20 that overlaps with the magnetoresistance effect element 10 when viewed from the z-direction should preferably be lower than the resistance value of the magnetoresistance effect element 10. In this case, the "resistance value of the magnetoresistance effect element 10" refers to the resistance value when electric current is supplied in the z-direction of the magnetoresistance effect element. Additionally, when the magnetoresistance effect element is a TMR, most of the resistance in the magnetoresistance effect element 10 is due to the resistance in the tunnel barrier layer. By setting the resistance values to have such a relationship, it is possible to suppress the flow of the electric current $I_1$ that is supplied to the spin-orbit torque wiring 20 into the magnetoresistance effect element 10. In other words, the electric current $I_1$ supplied to the spin-orbit torque wiring 20 can be made to more efficiently contribute to the generation of pure spin current.

Additionally, there is also the advantage that, when the magnetoresistance effect element 10 has shape anisotropy, the magnetization of the second ferromagnetic metal layer 2 is more easily reversed. When the magnetization of the second ferromagnetic metal layer 2 is oriented in the z-direction, magnetization rotation must be triggered in order to rotate the magnetization by SOT. The magnetization rotation may be triggered by applying an external magnetic field or the like. However, if a magnetic field generation source is provided outside the element, the overall size of the spin-orbit torque type magnetoresistance effect element 100 will become large. Therefore, the magnetization rotation may be triggered, even in an environment lacking a magnetic field, by providing the magnetoresistance effect element 10 with shape anisotropy.

When the magnetoresistance effect element 10 has shape anisotropy, the intensity of the demagnetizing field of the magnetoresistance effect element 10 will differ between the long-axis direction (direction of length L1) and the short-axis direction (direction of length L2). In other words, there will be a distribution in the intensity of the demagnetizing field. The demagnetizing field is a reverse-oriented magnetic field that is generated inside a ferromagnetic body by the magnetic poles formed at the ends of a magnetic body. For this reason, the intensity of the demagnetizing field becomes greater as the polarizability of the magnetic poles becomes greater and as the distance between the magnetic poles becomes smaller. In the case of the magnetoresistance effect element 10 illustrated in FIG. 11, the intensity of the demagnetizing field in the short-axis direction (direction of length L2) is greater than the intensity of the demagnetizing field in the long-axis direction (direction of length L1). The demagnetizing field generates a restoring force that tends to return the magnetization of the second ferromagnetic metal layer to the original state when the magnetization begins to rotate. The restoring force counteracts the magnetization rotation, and as the restoring force becomes greater, it becomes more difficult to rotate the magnetization.

For this reason, the ease of rotation of the magnetization of the second ferromagnetic metal layer 2 differs between the rotation direction along the long-axis direction (hereinafter referred to as the first rotation direction) and the rotation direction along the short-axis direction (hereinafter referred to as the second rotation direction). The intensity of the restoring force that is encountered when rotating the magnetization is greater in the short-axis direction. For this reason, the magnetization is more easily rotated along the first rotation direction than along the second rotation direction. In other words, the first rotation direction is a magnetization-reversal-facilitated direction. As illustrated in FIG. 14, the magnetoresistance effect element 12, which is square-shaped in plan view when viewed from the z-direction, does not have a magnetization-reversal-facilitated direction. Additionally, when considering that it is necessary to make the areas of magnetoresistance effect elements the same in order to ensure thermal stability, the length L1 of the magnetoresistance effect element 10 in the x-direction must be longer than the length L1' of the magnetoresistance effect element 12 in the x-direction. In other words, the energy necessary for reversing the magnetization of the magnetoresistance effect element 10 is less than the energy necessary for reversing the magnetization of the magnetoresistance effect element 12.

In this case, the length L1 of the magnetoresistance effect element 10 in the long-axis direction should preferably be at least 10 nm and not more than 60 nm, and the length L2 in the short-axis direction should preferably be smaller than L1. When the size of the magnetoresistance effect element 10 is large, magnetic domains are formed inside the second ferromagnetic metal layer 2. When magnetic domains are formed, the stability of the magnetization of the second ferromagnetic metal layer decreases. Additionally, the length of the magnetoresistance effect element 10 in the long-axis direction is preferably at least twice, more preferably at least four times, the length in the short-axis direction. If the ratio between the lengths of the magnetoresistance effect element 10 in the long-axis direction and the short-axis direction is within said range, then a sufficient difference is obtained in the restoring force due to the demagnetizing field.

FIG. 15 is a diagram illustrating the spin-orbit torque type magnetoresistance effect element according to the present embodiment, when viewed from the z-direction. FIG. 15(a) corresponds to a diagram illustrating the spin-orbit torque type magnetoresistance effect element 100 illustrated in FIG. 11, when viewed from the z-direction. There are no particular limitations on the shape of the magnetoresistance effect element as long as the length L1 in the x-direction is longer than the length (width) L2 in the y-direction. The shape may be rectangular as in the magnetoresistance effect element 10 illustrated in FIG. 15(a), or elliptical as in the magnetoresistance effect element 13 illustrated in FIG. 15(b).

As in the magnetoresistance effect element 14 illustrated in FIG. 15(c), the configuration may be such that the planar shape when viewed from the z-direction has an inscribed elliptical region E and external regions A on the outside, in the x-direction, of the elliptical region E. By forming the external regions A, it is possible to make the area of the magnetoresistance effect element 14 larger. If the area of the magnetoresistance effect element 14 is made larger, the magnetization stability is increased and magnetization reversals due to thermal disturbances or the like can be avoided.

As in the magnetoresistance effect element 15 illustrated in FIG. 15(d), the long axis of the magnetoresistance effect element 10 may be inclined by an angle θ with respect to the direction of extension (x-direction) of the spin-orbit torque wiring 20.

As mentioned above, the magnetization-reversal-facilitated direction is formed in the long-axis direction of the magnetoresistance effect element 10. In other words, in the magnetoresistance effect element 15, the magnetization-reversal-facilitated direction has a component in the y-direction.

The spin that is generated in the spin-orbit torque wiring 20 by the spin Hall effect is aligned with the outer surface of the spin-orbit torque wiring 20. In other words, the spin injected from the spin-orbit torque wiring 20 into the magnetoresistance effect element 10 is oriented in the y-axis direction. That is, the spin most efficiently contributes to magnetization reversal of magnetization having a component in the y-direction.

In other words, due to the magnetization-reversal-facilitated direction of the magnetoresistance effect element 15 having a y-direction component, the magnetization can be strongly influenced by SOT acting in the y-direction. That is, the SOT can be made to efficiently act on the magnetization reversal, and the magnetization can be reversed without applying any external forces such as an external magnetic field.

As illustrated in FIG. 15, a magnetoresistance effect element having anisotropy in one direction can be fabricated by photolithography or the like.

FIG. 16 is a diagram illustrating the correspondence between the shape of a photomask PM and the planar shape of the resulting magnetoresistance effect element 10, when viewed from the z-direction. As illustrated in FIG. 16(a), even when the shape of one photomask PM is rectangular, the planar shape of the magnetoresistance effect element 10 becomes elliptical or the like. This is because some of the light that has passed through the photomask PM is scattered and cures the resist. Additionally, in etching processes such as ion milling, etching proceeds more easily in the areas forming corners.

When external regions A are to be formed outside an elliptical region E as illustrated in FIG. 15(c), the photomask is shaped as illustrated in FIG. 16(b) and FIG. 16(c). The photomask PM1 illustrated in FIG. 16(b) has a rectangular region Re in which the ellipse can be inscribed, and projecting regions Pr1 at the corners Ed of the rectangular region Re. Additionally, the photomask PM2 illustrated in FIG. 16(c) has a rectangular region Re in which the ellipse can be inscribed, and projecting regions Pr2 on the long sides Sd of the rectangular region Re. The rectangular regions Re in FIGS. 16(b) and (c) correspond to the photomask illustrated in FIG. 16(a).

By providing projecting regions Pr1 at the corners Ed as illustrated in FIG. 16(b), it is possible to delay the progress in the etching of the corners Ed during the etching process. As a result thereof, external regions A can be formed as illustrated in FIG. 15(c). Additionally, by providing projecting regions Pr2 on the sides Sd as illustrated in FIG. 16(c), the etching rate difference between the sides Sd and the corners Ed during the etching process can be made larger. As a result thereof, external regions A can be formed as illustrated in FIG. 15(c).

As another method, spot exposure can be performed by using light having directionality, such as a laser. For example, a negative resist is used, and light is shone only at the parts that are to be cured, thereby processing the resist into a predetermined shape. In this case as well, even if the shape of the spot that is exposed is rectangular, the resulting shape will be elliptical.

When the planar shape of the magnetoresistance effect element 10 is to be made rectangular when viewed from the z-direction, as illustrated in FIG. 15(a), the magnetoresistance effect element 10 is processed in two steps. In other words, the process is divided into a first step of processing a stacked body having the first ferromagnetic metal layer, and the non-magnetic layer and the second ferromagnetic metal layer in one direction, and a second step of processing the stacked body, after having been processed in the one direction, in another direction that intersects with the one direction.

The drawings illustrated in FIG. 11 to FIG. 16 may be drawn with characteristic portions enlarged as appropriate to facilitate comprehension of the principles and features, and the shapes and dimensional ratios between the constituent elements and the like may differ from the actual values. Additionally, the drawings illustrated in FIG. 11 to FIG. 16 show only portions of characteristic features as appropriate in order to facilitate comprehension of the principles and features.

REFERENCE SIGNS LIST 200, 200A, 200B Magnetic memory
1 First ferromagnetic metal layer
2 Second ferromagnetic metal layer
3 Non-magnetic layer
10, 10a, 10b, 10c, 10d, 10e, 10f, 11, 12, 13, 14, 15 Magnetoresistance effect element
20, 20a, 20b, 20c, 20d Spin-orbit torque wiring
21, 21a, 21b, 21c, 21d, 22, 22a, 22b, 22c, 22d Resistance
100, 100a, 100b, 100c, 100d, 102 Spin-orbit torque type magnetoresistance effect element
101 Spin-transfer torque type magnetoresistance effect element
110, 110a, 110b, 110c, 110d Read control element
120, 120a, 120b, 120c, 120d Element selection control element
130, 130a, 130b, 130c, 130d Write control element
T Control element
S Source electrode
D Drain electrode
C Channel
151-157, 171-173, 181 Wiring
161 Through-via
191 Insulating layer
192 Magnetic-field-providing wiring

What is claimed is:

1. A magnetic memory comprising:
a plurality of spin-orbit torque magnetoresistance effect elements, each of which includes a spin-orbit torque wiring and a ferromagnetic metal layer disposed in a first direction of the spin-orbit torque wiring, the first direction being a stacking direction of ferromagnetic metal layer on the spin-orbit torque wiring;
a plurality of pairs of individual control elements, each of which is electrically connected to each of the spin-orbit torque magnetoresistance effect elements; and
a shared control element electrically connected to two or more of the spin orbit torque magnetoresistance effect elements,
wherein an area for storing an 1-bit information in a planar view in the first direction is 16 $F^2$ or more and 1056 $F^2$ or less, F being a unit of a minimum processing size of length in a circuit configuration is 7 nm, 10 nm, or 28 nm.

2. The magnetic memory according to claim 1, wherein the area for storing an 1-bit information is an area occupied by the spin-orbit torque magnetoresistance effect elements and the pairs of individual control elements in the planar view in the first direction.

3. The magnetic memory according to claim 1, wherein in a case where a second direction and a third direction are defined as a direction that the spin-orbit torque wiring extends and a direction that intersects the second direction, respectively, a length of the area for storing an 1-bit information in the third direction is 8 F.

4. The magnetic memory according to claim 1, wherein in a case where a second direction and a third direction are defined as a direction that the spin-orbit torque wiring extends and a direction that intersects the second direction, respectively, individual control elements forming a single pair among the pairs of individual control elements are proximately arranged in the third direction.

5. The magnetic memory according to claim 1, wherein each of the plurality of pairs of individual control elements is electrically connected to the spin-orbit torque wiring, and
two connection points of a single pair of the individual control elements to the spin-orbit torque wiring are separately disposed in positions interposing the ferromagnetic metal layer therebetween as planar viewed in the first direction.

6. The magnetic memory according to claim 1, wherein one of a single pair of the individual control elements is electrically connected to the spin-orbit torque wiring, and
other of the single pair of the individual control elements is electrically connected to the ferromagnetic metal layer.

7. A magnetic memory comprising;
a magnetoresistance effect element; and
three control elements electrically connected to the magnetoresistance effect element,
wherein an area for storing an 1-bit information in a planar view in a first direction is 16 $F^2$ or more and 1056 $F^2$ or less, F being a unit of a minimum processing size of length in a circuit configuration is 7 nm, 10 nm, or 28 nm.

* * * * *